United States Patent
Chen et al.

(10) Patent No.: US 12,094,756 B2
(45) Date of Patent: Sep. 17, 2024

(54) SEMICONDUCTOR ARRANGEMENT COMPRISING ISOLATION STRUCTURE COMPRISING AT LEAST TWO ELECTRICAL INSULATOR LAYERS

(71) Applicant: TAIWAN SEMICONDUCTOR MANUFACTURING COMPANY LIMITED, Hsin-Chu (TW)

(72) Inventors: Wei-Liang Chen, Tainan (TW); Cheng-Hsien Chen, Tainan (TW); Yu-Lung Yeh, Kaohsiung (TW); Chuang Chihchous, Fongshan (TW); Yen-Hsiu Chen, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 17/874,424

(22) Filed: Jul. 27, 2022

(65) Prior Publication Data

US 2022/0367247 A1    Nov. 17, 2022

Related U.S. Application Data

(62) Division of application No. 16/866,612, filed on May 5, 2020, now Pat. No. 11,562,923.

(51) Int. Cl.
*H01L 21/762* (2006.01)
*H01L 21/02* (2006.01)
(Continued)

(52) U.S. Cl.
CPC .... *H01L 21/76224* (2013.01); *H01L 21/3065* (2013.01); *H01L 21/31116* (2013.01);
(Continued)

(58) Field of Classification Search
CPC ..... H01L 21/76224–76237; H01L 21/823481; H01L 21/823878; H01L 29/0653; H01L 21/022; H01L 21/02109; H01L 21/02112; H01L 21/02225; H01L 21/02271; H01L 21/02266; H01L 21/02274; H01L 21/0228; H01L 21/02315; H01L 21/2855;
(Continued)

(56) References Cited

U.S. PATENT DOCUMENTS

| 5,719,085 A | * | 2/1998 | Moon | H01L 21/76235 |
| | | | | 257/E21.549 |
| 6,030,881 A | | 2/2000 | Papasouliotis et al. | |
| 7,097,886 B2 | * | 8/2006 | Moghadam | H01L 21/0228 |
| | | | | 257/E21.279 |
| 8,697,579 B2 | * | 4/2014 | Park | H01L 21/76229 |
| | | | | 257/E21.32 |

(Continued)

FOREIGN PATENT DOCUMENTS

| CN | 101414551 A | 4/2009 |
| CN | 110265353 A | 9/2019 |

(Continued)

OTHER PUBLICATIONS

First Office Action cited in corresponding Chinese patent application No. 202011622315.1, dated Jun. 27, 2024, 16 pages.

*Primary Examiner* — Sonya McCall-Shepard
(74) *Attorney, Agent, or Firm* — Cooper Legal Group, LLC

(57) ABSTRACT

A semiconductor arrangement includes an isolation structure having a first electrical insulator layer in a trench in a semiconductor substrate and a second electrical insulator layer in the trench and over the first electrical insulator layer.

20 Claims, 17 Drawing Sheets

(51) Int. Cl.
    *H01L 21/3065* (2006.01)
    *H01L 21/311* (2006.01)
    *H01L 21/8234* (2006.01)
    *H01L 27/088* (2006.01)
    *H01L 29/08* (2006.01)
    *H01L 29/10* (2006.01)

(52) U.S. Cl.
    CPC ............... *H01L 21/823418* (2013.01); *H01L 21/823481* (2013.01); *H01L 29/0847* (2013.01)

(58) Field of Classification Search
    CPC ......... H01L 21/28556; H01L 21/31116; H01L 21/32136; H01L 21/67017; H01L 21/67213; H01L 21/823418; H01L 29/0847; H01L 27/088; H01L 21/76229; H01L 21/02164; H01L 21/02211; H01L 21/31053; H01L 21/31056; H01L 21/76837; H01L 21/02126; H01L 21/02282; H01L 21/76819; H01L 29/6659; H01L 29/7833; H01L 29/0649–0653; H01L 21/76; H01L 21/762; H01L 21/76283; H01L 29/7846; H01L 2027/11829; H01L 2027/11831; H01L 29/0642; H01L 21/3065; H01J 37/32009; H01J 2237/334; C23C 14/021; C23C 14/046; C23C 16/0227; C23C 16/045; C23C 16/45544; C23C 16/505
    See application file for complete search history.

(56) References Cited

U.S. PATENT DOCUMENTS

| | | | |
|---|---|---|---|
| 9,112,025 B2 * | 8/2015 | Wang | H01L 29/7835 |
| 10,483,154 B1 * | 11/2019 | Smith | H01L 21/76283 |
| 2003/0003682 A1 | 1/2003 | Moll et al. | |
| 2003/0224580 A1 | 4/2003 | Huang et al. | |
| 2003/0157812 A1 | 8/2003 | Narwankar et al. | |
| 2005/0170606 A1 | 8/2005 | Fu et al. | |
| 2006/0115941 A1 | 6/2006 | Kim et al. | |
| 2008/0121958 A1 * | 5/2008 | Izumi | H10B 53/30 |
| | | | 257/295 |
| 2011/0117721 A1 * | 5/2011 | Kim | H01L 21/76229 |
| | | | 438/428 |
| 2011/0151678 A1 | 6/2011 | Ashtiani et al. | |
| 2015/0093907 A1 | 4/2015 | Yieh et al. | |
| 2018/0151412 A1 * | 5/2018 | Huang | H01L 21/76819 |
| 2019/0378844 A1 * | 12/2019 | Chen | H01L 21/76229 |

FOREIGN PATENT DOCUMENTS

| | | |
|---|---|---|
| JP | H11274471 A | 10/1999 |
| JP | 20000260952 A | 9/2000 |
| JP | 2002176174 A | 6/2002 |
| JP | 2009277909 A | 11/2009 |
| JP | 2012235143 | 11/2012 |
| KR | 20000059285 A | 10/2000 |
| KR | 20060038620 A | 5/2006 |
| KR | 20060075928 | 7/2006 |
| KR | 20090072216 A | 7/2009 |
| TW | 201523791 A | 6/2015 |

* cited by examiner

SEMICONDUCTOR ARRANGEMENT COMPRISING ISOLATION STRUCTURE COMPRISING AT LEAST TWO ELECTRICAL INSULATOR LAYERS

RELATED APPLICATION

This application is a divisional of and claims priority to U.S. patent application Ser. No. 16/866,612, titled "SEMICONDUCTOR ARRANGEMENT AND METHOD OF MAKING" and filed on May 5, 2020, which is incorporated herein by reference.

BACKGROUND

Semiconductor arrangements are used in a multitude of electronic devices, such as mobile phones, laptops, desktops, tablets, watches, gaming systems, and various other industrial, commercial, and consumer electronics. Semiconductor arrangements generally comprise semiconductor portions and isolation portions formed adjacent to the semiconductor portions. Shallow trench isolation (STI) has become an important isolation technology in semiconductor devices. One of the purposes of STI is to prevent carriers, such as electrons or electron-holes, from drifting between two adjacent semiconductor elements.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
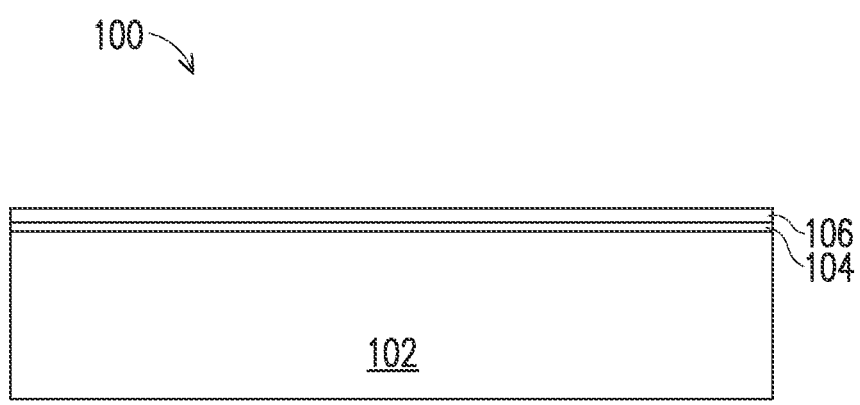
FIGS. 1-9 are illustrations of a semiconductor arrangement at various stages of fabrication, according to some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

One or more techniques for fabricating a semiconductor arrangement are provided herein. According to some embodiments, a semiconductor arrangement and method of forming a semiconductor arrangement are provided. In some embodiments, a trench is formed in a semiconductor substrate. In some embodiments, a first electrical insulator layer is formed in the trench. In some embodiments, a second electrical insulator layer is formed in the trench and over the first electrical insulator layer. In some embodiments, a third electrical insulator layer is formed in the trench and over the second electrical insulator layer. In some embodiments, the first electrical insulator layer is formed at a first rate, and the second electrical insulator layer is formed at a second rate. In some embodiments, the second rate is less than the first rate. In some embodiments, the third electrical insulator layer is formed at a third rate. In some embodiments, the third rate is greater than the second rate. According to some embodiments, electrical insulator layers are formed in a deposition chamber. According to some embodiments, the rate at which an electrical insulator layer is formed in a deposition chamber is based on at least one of a property of a carrier gas in a deposition chamber, a concentration of a carrier gas in a deposition chamber, a concentration of a plasma in a deposition chamber, or other suitable parameters.

According to some embodiments, forming a first electrical insulator layer in a trench comprises depositing electrical insulation material into the trench at a first deposition rate and concurrently etching the deposited electrical insulation material from the first electrical insulator layer at a first etching rate. According to some embodiments, forming a second electrical insulator layer in the trench comprises depositing electrical insulation material into the trench at a second deposition rate and concurrently etching the deposited electrical insulation material from the second electrical insulator layer at a second etching rate. According to some embodiments, forming a third electrical insulator layer over the second electrical insulator layer comprises depositing electrical insulation material over the second electrical insulator layer at a third deposition rate and concurrently etching the deposited electrical insulation material from the third electrical insulator layer at a third etching rate. According to some embodiments, the first electrical insulator layer has a first density, and the second electrical insulator layer has a second density, different than the first density. According to some embodiments, the third electrical insulator layer has a third density, different than the second density. According to some embodiments, the rate at which an electrical insulator layer is etched in a deposition chamber is based on at least one of a property of a carrier gas in a deposition chamber, a concentration of a carrier gas in a deposition chamber, a concentration of a plasma in a deposition chamber, or other suitable parameters. According to some embodiments, an isolation structure of a semiconductor arrangement formed by at least one of iteratively or concurrently depositing and etching one or more materials formed in a trench has a relatively high aspect ratio, such as relatively tall and narrow/skinny, with little to no void that would otherwise occur, such as due to at least one of pinch-off or collapse, as one or more materials are formed into a relatively high aspect ratio trench, as compared to an isolation structure that is not formed by at least one of iteratively or concurrently depositing and etching one or more materials into such a high aspect ratio trench.

FIGS. 1-9 are illustrations of a semiconductor arrangement at various stages of fabrication, according to some embodiments.

Turning to FIG. 1, at least some of a semiconductor arrangement 100 is formed on a substrate 102. In some embodiments, the substrate 102 comprises at least one of an epitaxial layer, a silicon-on-insulator (SOI) structure, a wafer, or a die formed from a wafer. In some embodiments, the substrate 102 comprises at least one of silicon, germanium, carbide, gallium, arsenide, germanium, arsenic, indium, oxide, sapphire, or other suitable materials. In some embodiments, the substrate 102 is at least one of a p-type substrate (P-substrate) or an n-type substrate (N-substrate).

According to some embodiments, a dielectric layer 104 is formed over the substrate 102. According to some embodiments, the dielectric layer 104 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), molecular beam epitaxy (MBE), liquid phase epitaxy (LPE), or other suitable techniques. In some embodiments, the dielectric layer 104 comprises at least one of a metal nitride, a high-k dielectric, a rare earth oxide, an aluminate of a rare earth oxide, a silicate of a rare earth oxide, or other suitable materials. According to some embodiments, the dielectric layer 104 comprises at least one of SiN, $SiO_2$, $Si_3N_4$, $TiO_2$, $Ta_2O_5$, $ZrO_2$, $Y_2O_3$, $La_2O_5$, $HfO_2$, or other suitable materials.

Still referring to FIG. 1, an etch stop layer 106 is formed over the dielectric layer 104, according to some embodiments. In some embodiments, the etch stop layer 106 is formed by at least one of PVD, sputtering, CVD, LPCVD, ALCVD, UHVCVD, RPCVD, MBE, LPE, or other suitable techniques. In some embodiments, the etch stop layer 106 comprises at least one of silicon oxynitride (SiON), SiN, SiC, carbon doped silicon oxide, or other suitable materials.

Figure 2:
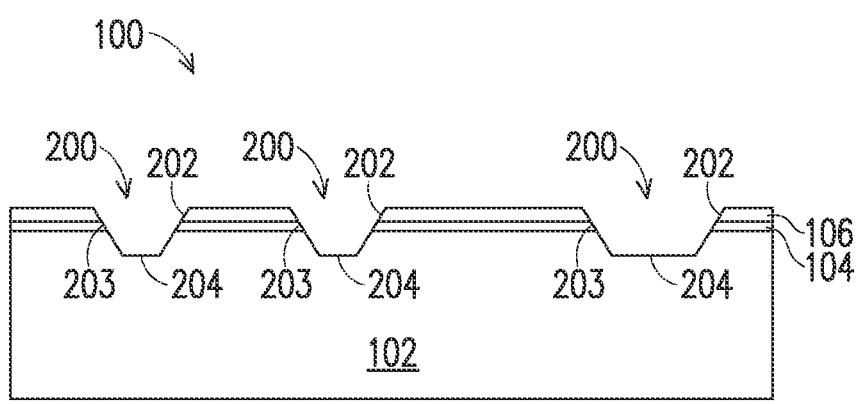

Referring to FIG. 2, according to some embodiments one or more trenches 200 are formed. In some embodiments, portions of the etch stop layer 106, portions of the dielectric layer 104, and portions of the substrate 102 are removed, such as by at least one of etching or other suitable techniques, to form the one or more trenches 200. In some embodiments, a trench is defined by one or more sidewalls or surfaces 202 of the etch stop layer 106, one or more sidewalls or surfaces 203 of the dielectric layer 104, and one or more sidewalls or surfaces 204 of the substrate 102. In some embodiments, a trench is at least 0.2 micrometers deep.

Figure 3:
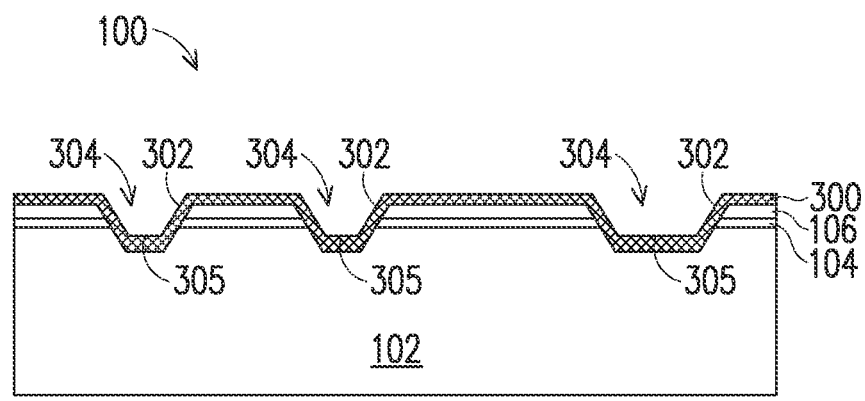

Referring to FIG. 3, according to some embodiments a first electrical insulator layer 300 is formed in at least one of the one or more trenches 200. In some embodiments, the first electrical insulator layer 300 is formed over at least one of the etch stop layer 106, the dielectric layer 104, or the substrate 102. According to some embodiments, the first electrical insulator layer 300 does not completely fill at least some of the one or more trenches 200, such that one or more first electrical insulator layer trenches 304 exist after the first electrical insulator layer 300 is formed. In some embodiments, a first electrical insulator layer trench is defined by one or more sidewalls 302 or surfaces 305 of the first electrical insulator layer 300.

According to some embodiments, the first electrical insulator layer 300 is formed by at least one of PVD, sputtering, CVD, LPCVD, ALCVD, UHVCVD, RPCVD, MBE, LPE, or other suitable techniques. In some embodiments, the first electrical insulator layer 300 is formed by depositing electrical insulation material over at least one of the etch stop layer 106, the dielectric layer 104, or the substrate 102. In some embodiments, the first electrical insulator layer 300 is formed by etching the first electrical insulator layer 300 at least one of while or after electrical insulation material is deposited. In some embodiments, the etching process is at least one of a plasma etching process, a reactive ion etching (RIE) process, a wet etching process, a sputter-etching process, or other suitable techniques.

In some embodiments, the first electrical insulator layer 300 is formed by sputter-etching the first electrical insulator layer 300 as the first electrical insulator layer 300 is forming in the trench 200. In some embodiments, the first electrical insulator layer 300 is sputter-etched in a deposition chamber at least one of while or after the first electrical insulator layer 300 is forming. According to some embodiments, the rate at which the first electrical insulator layer 300 is sputter-etched is based on at least one of a property of a carrier gas in a deposition chamber, a concentration of a carrier gas in a deposition chamber, a concentration of a plasma in a deposition chamber, or other suitable parameters. According to some embodiments, the rate at which the first electrical insulator layer 300 is sputter-etched is based on the atomic mass of the carrier gas. According to some embodiments, the atomic mass of the carrier gas is less than 11 atomic mass units (amu). According to some embodiments, the carrier gas is Helium.

According to some embodiments, the first electrical insulator layer 300 is comprised of a dielectric material. According to some embodiments, the first electrical insulator layer 300 comprises at least one of oxide, nitride, or other suitable materials. According to some embodiments, an effective deposit or deposition rate of the first electrical insulator layer 300 or rather the electrical insulation material that forms the first electrical insulator layer 300 corresponds to a rate at which the electrical insulation material is deposited relative to a rate at which deposited electrical insulation material is concurrently or subsequently removed, such as by etching. According to some embodiments, the effective deposition rate of the first electrical insulator layer 300 is such that deposited electrical insulation material accumulates faster near the bottom of a trench as compared to sides of the trench such that sides or sidewalls of the first electrical insulator layer 300 do not touch one another before the trench is entirely filled. In some embodiments, a void, such as of air, is not formed in the trench, such as defined between the bottom and sidewalls of the first electrical insulator layer 300.

Figure 4:
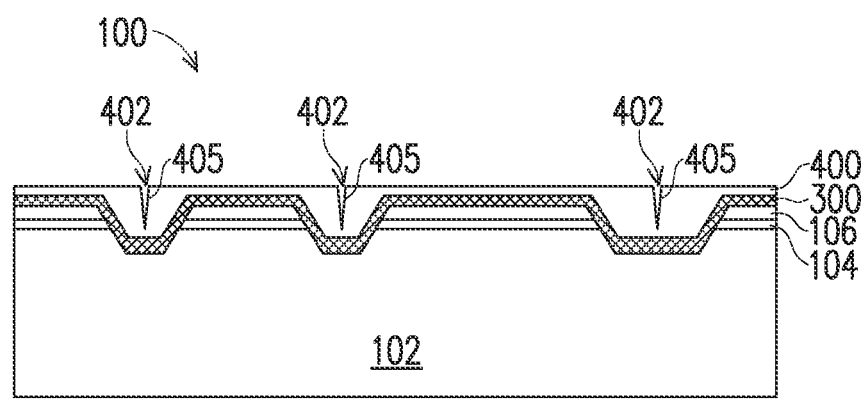

Referring to FIG. 4, according to some embodiments a second electrical insulator layer 400 is formed over the first electrical insulator layer 300. According to some embodiments, the second electrical insulator layer 400 does not completely fill at least some of the one or more first electrical insulator layer trenches 304, such that one or more second electrical insulator layer trenches 402 exist after the second electrical insulator layer 400 is formed. In some embodiments, a second electrical insulator layer trench is defined by one or more sidewalls or surfaces 405 of the second electrical insulator layer 400.

According to some embodiments, the second electrical insulator layer 400 is formed by at least one of the techniques referenced above with respect to forming the first electrical insulator layer 300 or other suitable techniques. According to some embodiments, the second electrical insulator layer 400 is formed by depositing electrical insulation material over the first electrical insulator layer 300. In some embodiments, the second electrical insulator layer 400 is formed by etching the second electrical insulator layer 400 at least one of while or after electrical insulation material is deposited. In some embodiments, the etching process is at least one of a plasma etching process, a reactive ion etching (RIE) process, a wet etching process, a sputter-etching process, or other suitable techniques.

In some embodiments, the second electrical insulator layer 400 is formed by sputter-etching the second electrical insulator layer 400 as the second electrical insulator layer 400 is forming over the first electrical insulator layer 300. In some embodiments, the second electrical insulator layer 400 is sputter-etched in a deposition chamber at least one of while or after the second electrical insulator layer 400 is forming. According to some embodiments, the rate at which the second electrical insulator layer 400 is sputter-etched is based on at least one of a property of a carrier gas in a deposition chamber, a concentration of a carrier gas in a deposition chamber, a concentration of a plasma in a deposition chamber, or other suitable parameters. According to some embodiments, the rate at which the second electrical insulator layer 400 is sputter-etched is based on the atomic mass of the carrier gas. According to some embodiments, the atomic mass of the carrier gas is less than 11 atomic mass units (amu). According to some embodiments, the carrier gas is Helium. According to some embodiments, the rate at which the second electrical insulator layer 400 is sputter-etched is greater than the rate at which the first electrical insulator layer 300 is sputter-etched.

According to some embodiments, the second electrical insulator layer 400 is comprised of a dielectric material. According to some embodiments, the second electrical insulator layer 400 comprises at least one of oxide, nitride, or other suitable materials. According to some embodiments, an effective deposit or deposition rate of the second electrical insulator layer 400 or rather the electrical insulation material that forms the second electrical insulator layer 400 corresponds to a rate at which the electrical insulation material is deposited relative to a rate at which deposited electrical insulation material is concurrently or subsequently removed, such as by etching. According to some embodiments, the effective deposition rate of the second electrical insulator layer 400 is such that deposited electrical insulation material accumulates faster near the bottom of a first electrical insulator layer trench as compared to sides of the first electrical insulator layer trench such that sides or sidewalls of the second electrical insulator layer 400 do not touch one another before the trench is entirely filled. In some embodiments, a void, such as of air, is not formed in the trench, such as defined between the bottom and sidewalls of the second electrical insulator layer 400. According to some embodiments, the effective deposition rate of the second electrical insulator layer 400 is at least one of less than, equal to, or greater than the effective deposition rate of the first electrical insulator layer 300.

Figure 5:
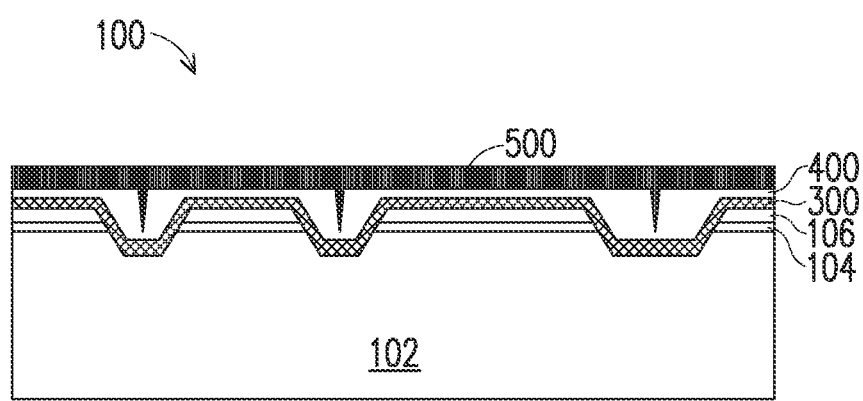

Referring to FIG. 5, according to some embodiments a third electrical insulator layer 500 is formed over the second electrical insulator layer 400. According to some embodiments, the third electrical insulator layer 500 is formed by at least one of the techniques referenced above with respect to forming the first electrical insulator layer 300 or other suitable techniques. According to some embodiments, the third electrical insulator layer 500 is formed by depositing electrical insulation material over the second electrical insulator layer 400. In some embodiments, the third electrical insulator layer 500 is formed by etching the third electrical insulator layer 500 at least one of while or after electrical insulation material is deposited. In some embodiments, the etching process is at least one of a plasma etching process, a reactive ion etching (RIE) process, a wet etching process, a sputter-etching process, or other suitable techniques.

In some embodiments, the third electrical insulator layer 500 is formed by sputter-etching the third electrical insulator layer 500 as the third electrical insulator layer 500 is forming over the second electrical insulator layer 400. In some embodiments, the third electrical insulator layer 500 is sputter-etched in a deposition chamber at least one of while or after the third electrical insulator layer 500 is forming. According to some embodiments, the rate at which the third electrical insulator layer 500 is sputter-etched is based on at least one of a property of a carrier gas in a deposition chamber, a concentration of a carrier gas in a deposition chamber, a concentration of a plasma in a deposition chamber, or other suitable parameters. According to some embodiments, the rate at which the third electrical insulator layer 500 is sputter-etched is based on the atomic mass of the carrier gas. According to some embodiments, the atomic mass of the carrier gas is less than 11 atomic mass units (amu). According to some embodiments, the carrier gas is Helium. According to some embodiments, the rate at which the third electrical insulator layer 500 is sputter-etched is less than the rate at which the second electrical insulator layer 400 is sputter-etched.

According to some embodiments, the third electrical insulator layer 500 is comprised of a dielectric material. According to some embodiments, the third electrical insulator layer 500 comprises at least one of oxide, nitride, or other suitable materials. According to some embodiments, an effective deposit or deposition rate of the third electrical insulator layer 500 or rather the electrical insulation material that forms the third electrical insulator layer 500 corresponds to a rate at which the electrical insulation material is deposited relative to a rate at which deposited electrical insulation material is concurrently or subsequently removed, such as by etching. According to some embodiments, the effective deposition rate of the third electrical insulator layer 500 is such that deposited electrical insulation material accumulates faster near the bottom of a second electrical insulator layer trench as compared to sides of the second electrical insulator layer trench such that sides or sidewalls of the third electrical insulator layer 500 do not touch one another before the trench is entirely filled. In some embodiments, a void, such as of air, is not formed in the trench, such as defined between the bottom and sidewalls of the third electrical insulator layer 500. According to some embodiments, the effective deposition rate of the third electrical insulator layer 500 is at least one of less than, equal to, or greater than at least one of the effective deposition rate of the first electrical insulator layer 300 or the effective deposition rate of the second electrical insulator layer 400.

According to some embodiments, two electrical insulator layers, such as the first electrical insulator layer 300 and the second electrical insulator layer 400 fill a trench. According to some embodiments, the first electrical insulator layer 300 and the second electrical insulator layer 400 form a shallow trench isolation (STI) structure in a trench. According to some embodiments, the first electrical insulator layer 300, the second electrical insulator layer 400, and the third electrical insulator layer 500 form a STI structure in a trench. According to some embodiments, any number of electrical insulator layers form a STI structure in a trench.

Figure 6:
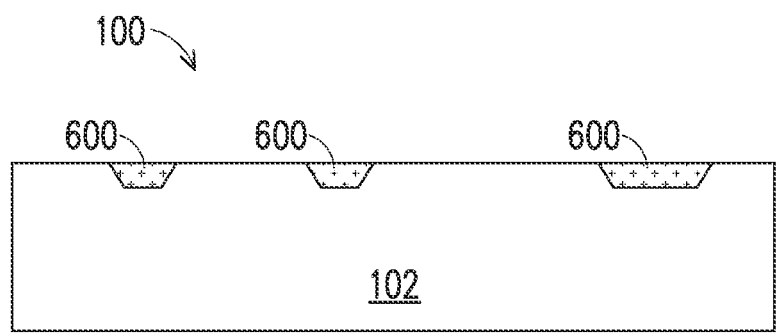

Referring to FIG. 6, for clarity of illustration, and not limitation, the first electrical insulator layer 300, the second electrical insulator layer 400, and the third electrical insulator layer 500 are illustrated in combination as one or more planarized STI structures 600. In FIG. 6, a planarized STI structure is illustrated without demarcations between the first electrical insulator layer 300, the second electrical insulator layer 400, and the third electrical insulator layer 500.

According to some embodiments, at least one of the first electrical insulator layer 300, the second electrical insulator layer 400, the third electrical insulator layer 500, the etch stop layer 106, or the dielectric layer 104 is planarized by at least one of chemical-mechanical planarization (CMP) or other suitable techniques. According to some embodiments, a planarized STI structure is planarized below at least one of the third electrical insulator layer 500, the second electrical insulator layer 400, the first electrical insulator layer 300, the etch stop layer 106, the dielectric layer 104, or the upper surface of the substrate 102. According to some embodiments, the planarized STI structure is planarized above at least one of the upper surface of the substrate 102, the dielectric layer 104, the etch stop layer 106, the first electrical insulator layer 300, or the second electrical insulator layer 400.

Figure 7:
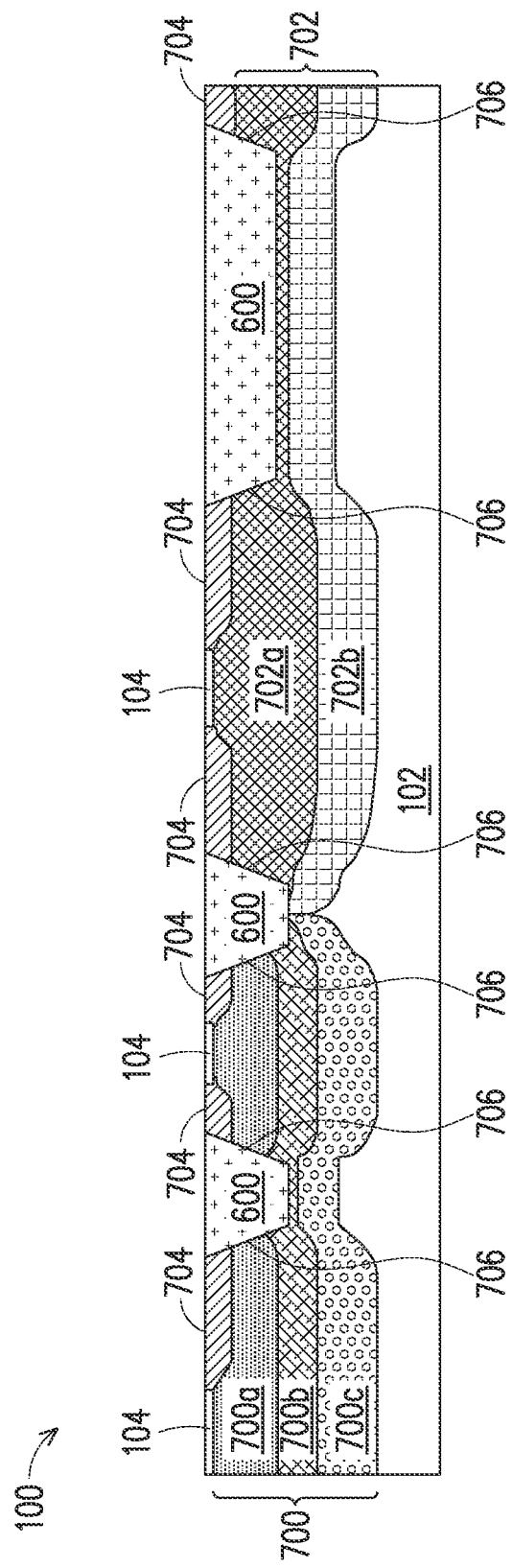

FIG. 7 illustrates the semiconductor arrangement 100 with additional features, elements, etc., according to some embodiments. A first doped region 700 is formed in the substrate 102, according to some embodiments. In some embodiments, the first doped region 700 is formed by at least one of ion implantation, molecular diffusion, or other suitable techniques. According to some embodiments, a number or amount of dopants implanted into the substrate 102 is controlled, such as to control a concentration of dopants in the first doped region 700. According to some embodiments, an energy of dopants implanted into the substrate 102 is controlled, such as to control a depth to which dopants are implanted into the substrate 102. A depth of dopants in the substrate 102 is controlled by increasing or decreasing a voltage used to direct the dopants into the substrate 102, according to some embodiments. In some embodiments, the first doped region 700 comprises at least one of p-type dopants or n-type dopants.

According to some embodiments, the first doped region 700 has a gradient such that a concentration of dopants changes, such as increases or decreases, as the first doped region 700 extends into the substrate 102. FIG. 7 illustrates by way of shading a first concentration of dopants 700a of the first doped region 700, a second concentration of dopants 700b of the first doped region 700, and a third concentration of dopants 700c of the first doped region 700, according to some embodiments.

FIG. 7 illustrates a second doped region 702 formed in the substrate 102, according to some embodiments. In some embodiments, the second doped region 702 is formed by at least one of ion implantation, molecular diffusion, or other suitable techniques. According to some embodiments, a number or amount of dopants implanted into the substrate 102 is controlled, such as to control a concentration of dopants in the second doped region 702. According to some embodiments, an energy of dopants implanted into the substrate 102 is controlled, such as to control a depth to which dopants are implanted into the substrate 102. A depth of dopants in the second doped region 702 is controlled by increasing or decreasing a voltage used to direct the dopants into the substrate 102. In some embodiments, the second doped region 702 comprises at least one of p-type dopants or n-type dopants.

According to some embodiments, the second doped region 702 has a gradient such that a concentration of dopants changes, such as increases or decreases, as the second doped region 702 extends into the substrate 102. FIG. 7 illustrates by way of hatching a first concentration of dopants 702a of the second doped region 702 and a second concentration of dopants 702b of the second doped region 702, according to some embodiments.

According to some embodiments, the semiconductor arrangement 100 comprises one or more conductive regions 704. According to some embodiments, at least some of the one or more conductive regions 704 are at least one of over the substrate 102 or in the substrate 102. According to some embodiments, at least some of the one or more conductive regions 704 are adjacent to sidewalls 706 of at least one planarized STI structure 600. According to some embodiments, adjacent corresponds to being in direct contact with none, some, or all of one or more sidewalls 706 of at least one planarized STI structure 600. According to some embodiments, the sidewalls 706 comprise a portion of the first electrical insulator layer 300.

According to some embodiments, at least some of the one or more conductive regions 704 are at least one of a source region or a drain region of the semiconductor arrangement 100. According to some embodiments, at least some of the one or more conductive regions 704 comprise dopants implanted into the substrate 102. According to some embodiments, at least some of the one or more conductive regions 704 comprise an n-type dopant. According to some embodiments, at least some of the one or more conductive regions 704 comprise at least one of Phosphorus (P), Arsenic (As), Antimony (Sb), at least one Group V element, or other suitable materials. According to some embodiments, at least some of the one or more conductive regions 704 comprise a p-type dopant. According to some embodiments, at least some of the one or more conductive regions 704 comprise at least one of Boron (B), Aluminum (Al), Gallium (Ga), Indium (In), at least one Group III element, or other suitable materials. According to some embodiments, conductive regions 704 adjacent to a same or single planarized STI structure 600 comprise a same dopant type. According to some embodiments, at least some of the one or more conductive regions 704 comprise a different dopant type than the dopant type of at least one of the first doped region 700 or the second doped region 702. According to some embodiments, at least some of the one or more conductive regions 704 comprise a dopant concentration greater than a dopant concentration of at least one of the first doped region 700 or the second doped region 702. According to some embodiments, at least some of the one or more conductive regions 704 comprise a dopant concentration less than a dopant concentration of at least one of the first doped region 700 or the second doped region 702.

In some embodiments, at least some of the one or more conductive regions 704 comprise fin structures. According to some embodiments, at least some of the one or more conductive regions 704 comprise epitaxy structures. In some embodiments, at least some of the one or more conductive regions 704 comprise at least one of silicon (Si), silicon phosphorus (SiP), silicon carbide phosphorus (SiCP), gallium antimony (GaSb), germanium (Ge), germanium tin (GeSn), or silicon germanium (SiGe).

Figure 8:
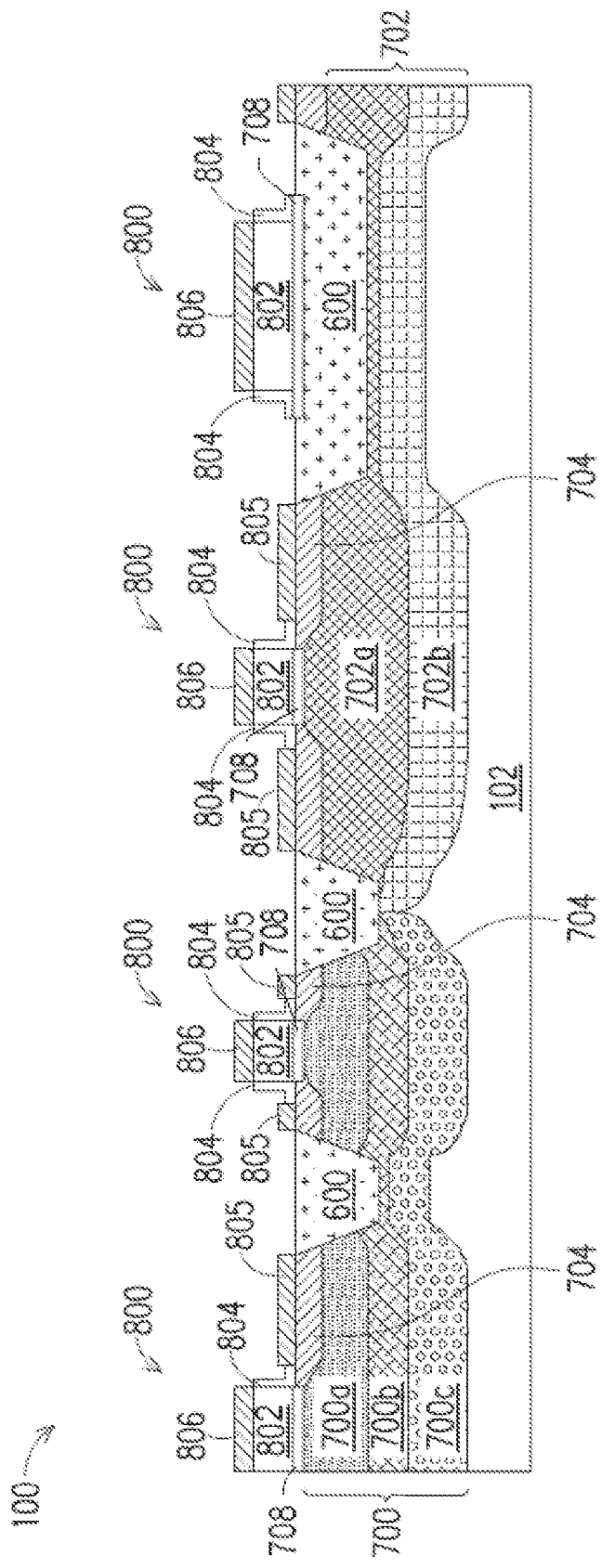

Referring to FIG. 8, according to some embodiments the semiconductor arrangement 100 comprises at least one of one or more gate stacks 800 or one or more contacts 805. According to some embodiments, at least some of the one or more gate stacks 800 comprise at least one of a dielectric region 708, such as from patterned dielectric layer 104, a gate electrode 802, a gate contact 806 formed over and in contact with the gate electrode 802, or a sidewall spacer 804. According to some embodiments, the gate electrode 802 comprises a conductive material. According to some embodiments, the gate electrode 802 comprises at least one of polysilicon, metal, or other suitable materials. According to some embodiments, the gate electrode 802 is doped with one or more dopants. According to some embodiments, at least one of the dielectric region 708 or the sidewall spacer 804 comprises a dielectric material. According to some embodiments, at least one of the dielectric region 708 or the sidewall spacer 804 comprises at least one of oxide, nitride, or other suitable materials. In some embodiments, the sidewall spacer 804 includes one or more layers, including silicon nitride, silicon oxynitride, silicon oxide, or other suitable dielectric materials. According to some embodiments, at least some of the one or more contacts 805 comprise at least one of polysilicon, metal, or other suitable materials. According to some embodiments, at least some of the one or more contacts 805 are doped with one or more dopants.

Figure 9:
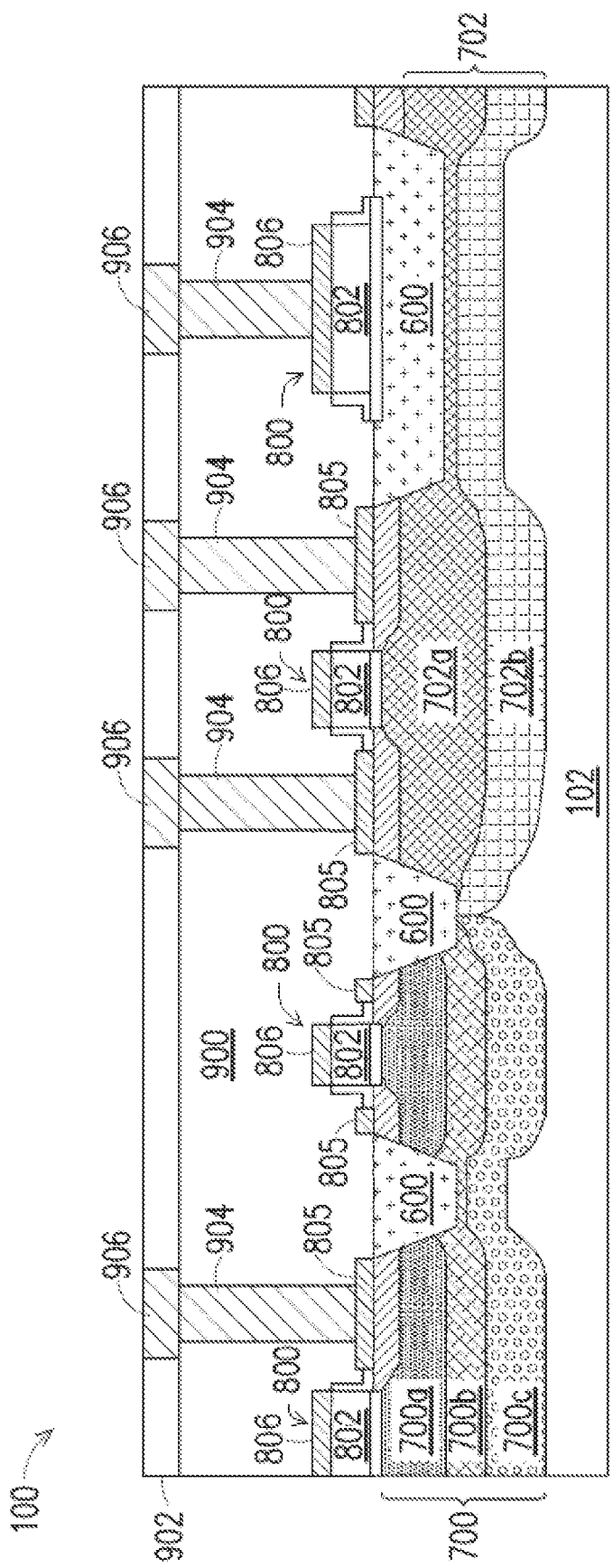

Referring to FIG. 9, in some embodiments the semiconductor arrangement 100 comprises a first dielectric layer 900 over at least one of at least some of the one or more gate stacks 800, at least some of the one or more contacts 805, or at least some of the one or more planarized STI structures 600. According to some embodiments, the first dielectric layer 900 is an interlayer dielectric (ILD) layer. In some embodiments, the first dielectric layer 900 comprises at least one of tetraethylorthosilicate (TEOS), borophosphosilicate glass (BPSG), fused silica glass (FSG), phosphosilicate glass (PSG), boron doped silicon glass (BSG), or other suitable materials. In some embodiments, the first dielectric layer 900 is formed by at least one of PVD, sputtering, CVD, LPCVD, ALCVD, UHVCVD, RPCVD, MBE, LPE, or other suitable techniques.

According to some embodiments, the semiconductor arrangement 100 comprises a second dielectric layer 902 over the first dielectric layer 900. In some embodiments, the second dielectric layer 902 comprises at least one of tetraethylorthosilicate (TEOS), borophosphosilicate glass (BPSG), fused silica glass (FSG), phosphosilicate glass (PSG), boron doped silicon glass (BSG), or other suitable materials. In some embodiments, the second dielectric layer 902 is formed by at least one of PVD, sputtering, CVD, LPCVD, ALCVD, UHVCVD, RPCVD, MBE, LPE, or other suitable techniques. According to some embodiments, the second dielectric layer 902 has a same material composition as the first dielectric layer 900. According to some embodiments, the second dielectric layer 902 does not have a same material composition as the first dielectric layer 900.

According to some embodiments, the semiconductor arrangement 100 comprises one or more vertical interconnect accesses (VIAs) 904 formed through the first dielectric layer 900. According to some embodiments, the semiconductor arrangement 100 comprises one or more metal layers 906 formed through the second dielectric layer 902. According to some embodiments, at least some of the one or more metal layers 906 are in electrical communication with at least some of the one or more VIAs 904, and at least some of the one or more VIAs 904 are in electrical communication with one or more contacts 805 such that a metal layer 906 and a VIA 904 provide an electrical pathway to a contact 805, such as for at least one of applying a voltage or conducting current.

In some embodiments, at least one of at least some of the one or more metal layers 906 or at least some of the one or more VIAs 904 are formed by at least one of lithography, etching, PVD, sputtering, CVD, LPCVD, ALCVD, UHVCVD, RPCVD, MBE, LPE, a dual damascene process, or other suitable techniques. In lithography, a light sensitive material such as a photoresist is formed over a layer to be patterned, such as the first dielectric layer 900. Properties, such as solubility, of the photoresist are affected by the light. The photoresist is either a negative photoresist or a positive photoresist. With respect to the negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative of a pattern defined by opaque regions of a template between the light source and the negative photoresist. In the positive photoresist, illuminated regions of the positive photoresist become soluble and are removed via application of the solvent during development. Thus, a pattern formed in the positive photoresist is a positive image of opaque regions of the template between the light source and the positive photoresist. According to some embodiments, an etchant has a selectivity such that the etchant removes or etches away the layer under the photoresist, such as the first dielectric layer 900, at a greater rate than the etchant removes or etches away the photoresist. Accordingly, an opening in the photoresist allows the etchant to form a corresponding opening in the layer under the photoresist, and thereby transfer a pattern in the photoresist to the layer under the photoresist. The pattern in the layer under the photoresist is filled with one or more materials to form one or more elements, features, etc., such as the one or more VIAs 904, and the patterned photoresist is stripped or washed away at least one of before or after the pattern in the layer under the photoresist is filled with the one or more materials.

According to some embodiments, at least one of at least some of the one or more metal layers 906 or at least some of the one or more VIAs 904 include at least one of Al, Cu, Sn, Ni, Au, Ag, W, or other suitable materials. In some embodiments, at least one of at least some of the one or more metal layers 906 or at least some of the one or more VIAs 904 do not include metal. According to some embodiments, at least some of the metal layers 906 have a same width. In some embodiments, at least some of the metal layers 906 have different widths. In some embodiments, at least some of the metal layers 906 have a same height. In some embodiments, at least some of the metal layers 906 have different heights. In some embodiments, at least some of the VIAs 904 have a same width. In some embodiments, at least some of the VIAs 904 have different widths. In some embodiments, at least some of the VIAs 904 have a same height. In some embodiments, at least some of the VIAs 904 have different heights.

According to some embodiments, a width of at least some of the metal layers 906 is different than a width of at least some of the VIAs 904. In some embodiments, a width of at least some of the metal layers 906 is the same as a width of at least some VIAs 904. In some embodiments, a height of at least some of the metal layers 906 is different than a height of at least some of the VIAs 904. In some embodiments, a height of at least some of the metal layers 906 is the same as a height of at least some of the VIAs 904.

Figure 10:
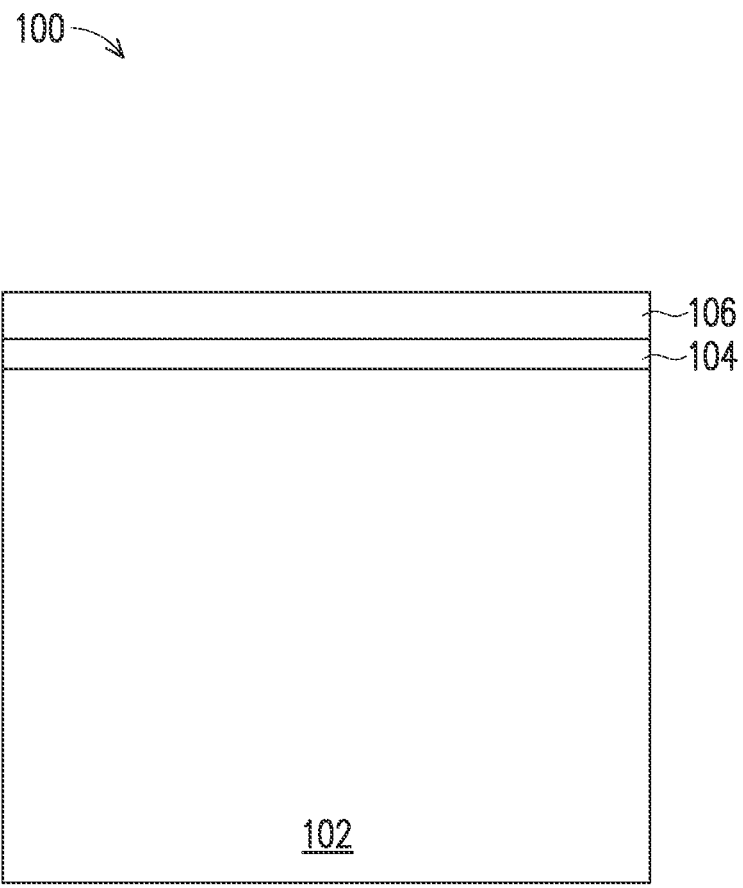
FIGS. 10-16 are cross-sectional views of a semiconductor arrangement at various stages of fabrication, according to some embodiments.

FIGS. 10-17 are cross-sectional illustrations of a semiconductor arrangement 100, such as depicting zoomed in views of an aforementioned STI structure 600, at various stages of fabrication, according to some embodiments. Turning to FIG. 10, at least one of a dielectric layer 104 or an etch stop layer 106 is formed over a substrate 102, according to some embodiments.

Figure 11:
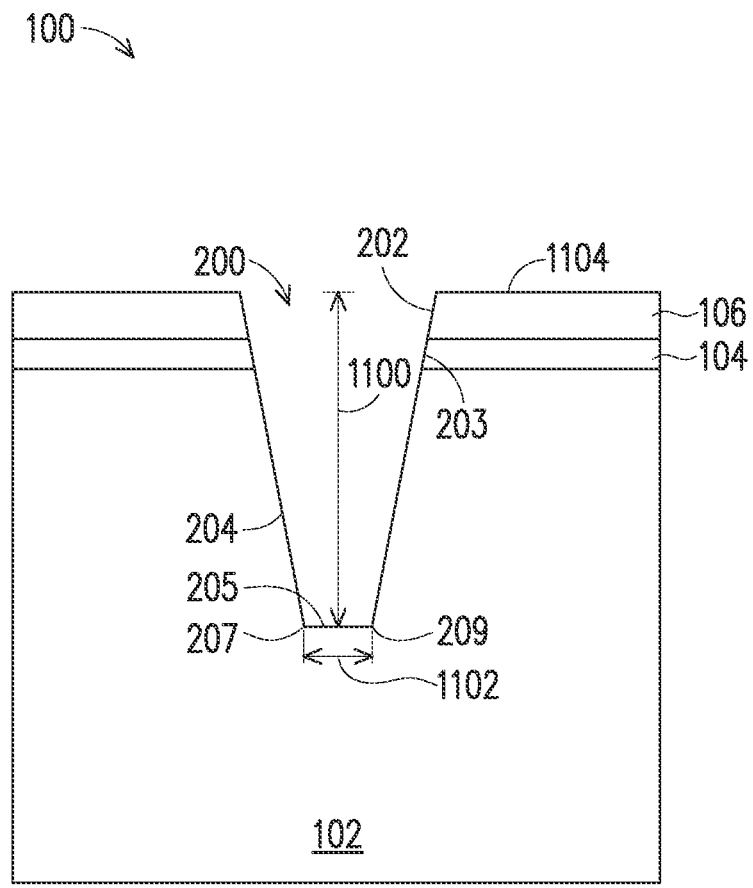

Referring to FIG. 11, according to some embodiments a trench 200 is formed by removing, such as by at least one of etching or other suitable techniques, some of the etch stop layer 106, the dielectric layer 104, and the substrate 102. In some embodiments, the trench is defined by one or more sidewalls or surfaces 202 of the etch stop layer 106, one or more sidewalls or surfaces 203 of the dielectric layer 104, and one or more sidewalls or surfaces 204 of the substrate 102.

According to some embodiments, the trench 200 has a trench height ($H_1$) 1100 corresponding to the distance from the surface 205 of the substrate 102 defining the bottom of the trench 200 to an upper surface 1104 of the etch stop layer 106. According to some embodiments, the trench has a trench width ($W_1$) 1102 corresponding to a length of the surface 205 or a distance between bottommost portions 207, 209 of the sidewalls of the substrate 102 that define the bottom of the trench 200. In some embodiments, the aspect ratio of the trench 200 is a ratio of the trench height ($H_1$) 1100 to the trench width ($W_1$) 1102.

Figure 12:
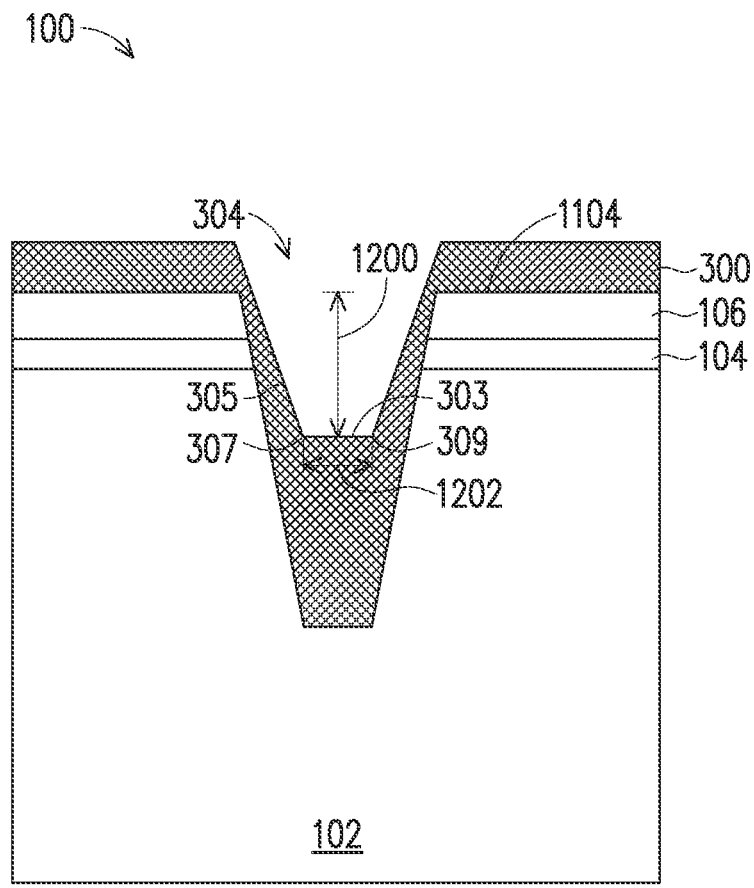

Referring to FIG. 12, according to some embodiments the first electrical insulation layer 300 forms as electrical insulation material is deposited into the trench 200 and over the etch stop layer 106 at a first deposition rate. According to some embodiments, the first deposition rate is based on the aspect ratio of the trench 200. According to some embodiments, if the aspect ratio $H_1/W_1$ is greater than or equal to 3, the first deposition rate is greater than or equal to 140 angstroms-per-second (A/sec). According to some embodiments, if the aspect ratio $H_1/W_1$ is less than 3, the first deposition rate is less than, equal to, or greater than 140 A/sec.

According to some embodiments, the first electrical insulation layer 300 forms as electrical insulation material is sputter-etched from the first electrical insulation layer 300 at a first etching rate at least one of while or after the electrical insulation material is deposited. According to some embodiments, the first etching rate or degree to which or rate at which the electrical insulation material is sputter-etched is based on the aspect ratio of the trench 200. According to some embodiments, if the aspect ratio $H_1/W_1$ is greater than or equal to 3, the first etching rate is less than or equal to 9 A/sec. According to some embodiments, if the aspect ratio $H_1/W_1$ is less than 3, the first etching rate is less than, equal to, or greater than 9 A/sec.

In some embodiments, given control of the first deposition rate and the first etching rate, the first electrical insulation layer 300 fills the trench 200 from the bottom up meaning that the electrical insulation material accumulates in the bottom of the trench 200 faster than the electrical insulation material accumulates on sidewalls of the trench 200.

In some embodiments, a first electrical insulator layer trench 304 exists as and after the first electrical insulation layer 300 is formed. In some embodiments, the first electrical insulator layer trench 304 is defined by one or more sidewalls 302 or surfaces 305 of the first electrical insulator layer 300. According to some embodiments, the first electrical insulator layer trench 304 has a trench height ($H_2$) 1200 corresponding to the distance from the surface 305 of the first electrical insulation layer 300 defining the bottom of the first electrical insulator layer trench 304 to an upper surface 1104 of the etch stop layer 106. According to some embodiments, the first electrical insulator layer trench 304 has a trench width ($W_2$) 1202 corresponding to a length of the surface 305 or a distance between bottommost portions 307, 309 of the sidewalls of the first electrical insulation layer 300 that define the bottom of the first electrical insulator layer trench 304. In some embodiments, the aspect ratio of the first electrical insulator layer trench 304 is a ratio of trench height ($H_2$) 1200 to trench width ($W_2$) 1202.

Figure 13:
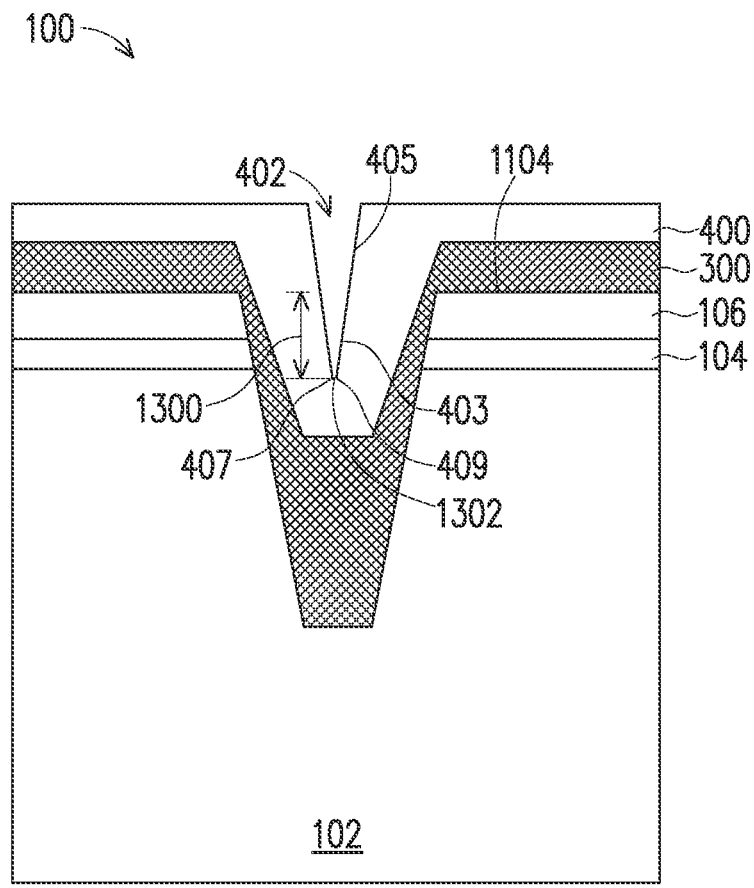

Referring to FIG. 13, according to some embodiments the second electrical insulation layer 400 forms as electrical insulation material is deposited into the first electrical insulator layer trench 304 and over the first electrical insulation layer 300 at a second deposition rate. According to some embodiments, the second deposition rate is based on the aspect ratio of the first electrical insulator layer trench 304.

According to some embodiments, if the aspect ratio $H_2/W_2$ is greater than or equal to 2, the second deposition rate is greater than or equal to 45 A/sec. According to some embodiments, if the aspect ratio $H_2/W_2$ is less than 2, the second deposition rate is less than, equal to, or greater than 45 A/sec. According to some embodiments, if $H_1/W_1$ is greater than $H_2/W_2$, then the second deposition rate is equal to or less than the first deposition rate.

According to some embodiments, the second electrical insulation layer 400 forms as electrical insulation material is sputter-etched from the second electrical insulation layer 400 at a second etching rate at least one of while or after the electrical insulation material is deposited. According to some embodiments, the second etching rate or degree to which or rate at which the electrical insulation material is sputter-etched is based on the aspect ratio of the first electrical insulator layer trench 304. According to some embodiments, if the aspect ratio $H_2/W_2$ is greater than or equal to 2, the second etching rate is less than or equal to 14 A/sec. According to some embodiments, if the aspect ratio $H_2/W_2$ is less than 2, the second etching rate is less than, equal to, or greater than 14 A/sec. According to some embodiments, the second etching rate is greater than the first etching rate.

In some embodiments, given control of the second deposition rate and the second etching rate, the second electrical insulation layer 400 fills the first electrical insulator layer trench 304 from the bottom up meaning that the electrical insulation material accumulates in the bottom of the first electrical insulator layer trench 304 faster than the electrical insulation material accumulates on sidewalls of the first electrical insulator layer trench 304.

In some embodiments, a second electrical insulator layer trench 402 exists as and after the second electrical insulation layer 400 is formed. In some embodiments, the second electrical insulator layer trench 402 is defined by one or more sidewalls or surfaces 405 of the second electrical insulator layer 400. According to some embodiments, the second electrical insulator layer trench 402 has a trench height ($H_3$) 1300 corresponding to the distance from the surface 403 of the second electrical insulator layer 400 defining the bottom of the second electrical insulator layer trench 402 to an upper surface 1104 of the etch stop layer 106. According to some embodiments, the second electrical insulator layer trench 402 has a trench width ($W_3$) 1302 corresponding to a length of the surface 403 or a distance between bottommost portions 407, 409 of the sidewalls of the second electrical insulator layer 400 that define the bottom of the second electrical insulator layer trench 402. In some embodiments, the aspect ratio of the second electrical insulator layer trench 402 is a ratio of trench height ($H_3$) 1300 to trench width ($W_3$) 1302.

Figure 14:
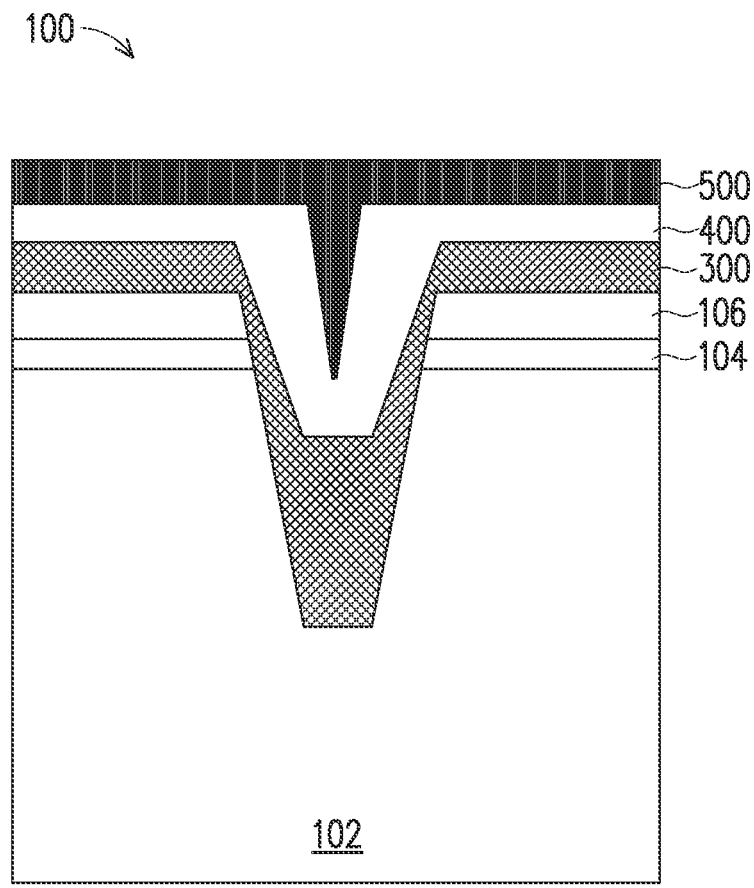

Referring to FIG. 14, according to some embodiments the third electrical insulation layer 500 forms as electrical insulation material is deposited into the second electrical insulator layer trench 402 and over the second electrical insulator layer 400 at a third deposition rate. According to some embodiments, the third deposition rate is based on the aspect ratio of the second electrical insulator layer trench 402.

According to some embodiments, if the aspect ratio $H_3/W_3$ is greater than or equal to 1, the third deposition rate is greater than or equal to 60 A/sec. According to some embodiments, if the aspect ratio $H_3/W_3$ is less than 1, the third deposition rate is less than, equal to, or greater than 60 A/sec. According to some embodiments, if $H_3/W_3$ is greater than $H_2/W_2$, then the third deposition rate is equal to or greater than the second deposition rate.

According to some embodiments, the third electrical insulation layer 500 forms as electrical insulation material is sputter-etched from the third electrical insulation layer 500 at a third etching rate at least one of while or after the electrical insulation material is deposited. According to some embodiments, the third etching rate or degree to which or rate at which the electrical insulation material is sputter-etched is based on the aspect ratio of the second electrical insulator layer trench 402. According to some embodiments, if the aspect ratio $H_3/W_3$ is greater than or equal to 1, the third etching rate is less than or equal to 8 A/sec. According to some embodiments, if the aspect ratio $H_3/W_3$ is less than 1, the third etching rate is less than, equal to, or greater than 8 A/sec. According to some embodiments, the third etching rate is less than the second etching rate.

In some embodiments, given control of the third deposition rate and the third etching rate, the third electrical insulation layer 500 fills the second electrical insulator layer trench 402 from the bottom up meaning that the electrical insulation material accumulates in the bottom of the second electrical insulator layer trench 402 faster than the electrical insulation material accumulates on sidewalls of the second electrical insulator layer trench 402.

Figure 15:
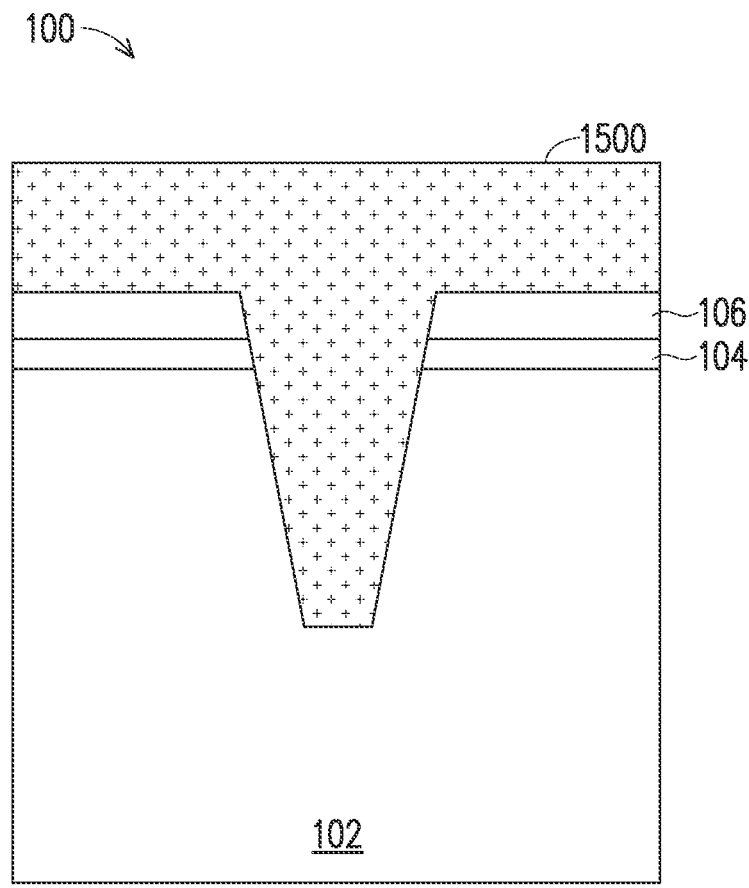

Referring to FIG. 15, for clarity of illustration, and not limitation, the first electrical insulator layer 300, the second electrical insulator layer 400, and the third electrical insulator layer 500 are illustrated in combination as an insulation structure 1500. In FIG. 15, the insulation structure 1500 is illustrated without demarcations between the first electrical insulator layer 300, the second electrical insulator layer 400, and the third electrical insulator layer 500.

Figure 16:
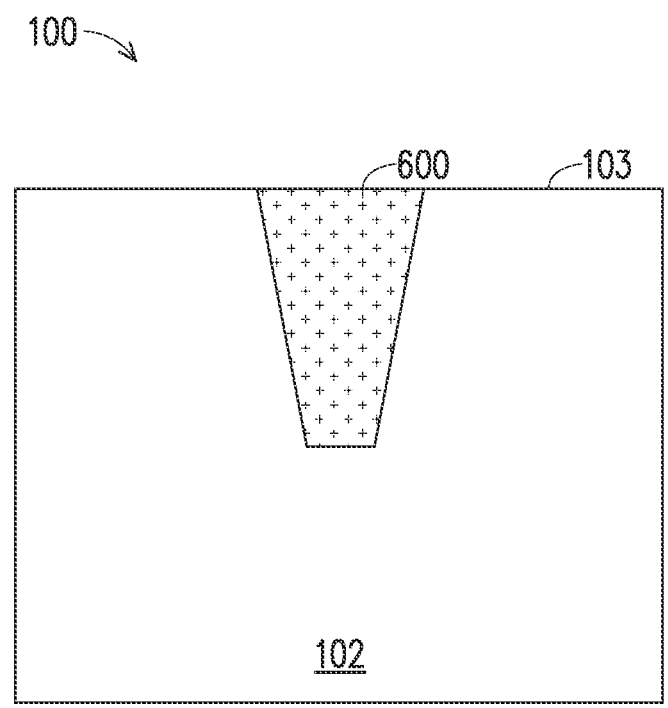

Referring to FIG. 16, in some embodiments a planarized STI structure 600 is formed by removing, such as by at least one of CMP or other suitable techniques, portions of the insulation structure 1500 above the uppermost surface 103 of the substrate 102, the etch stop layer 106, and the dielectric layer 104. In some embodiments, not all of at least one of the portions of the insulation structure 1500 above the uppermost surface 103 of the substrate 102, the etch stop layer 106, or the dielectric layer 104 are removed. According to some embodiments, portions of the insulation structure 1500 that are removed are based on at least one of features or devices of the semiconductor arrangement 100. According to some embodiments, portions of the insulation structure 1500 that are removed are based on devices to-be formed over the substrate 102. According to some embodiments, portions of the insulation structure 1500 that are removed are based on subsequent processing of the semiconductor arrangement 100. According to some embodiments, portions of the insulation structure 1500 that are removed are based on one or more performance requirements of the semiconductor arrangement 100. According to some embodiments, portions of the insulation structure 1500 that are removed are based on one or more design requirements of the semiconductor arrangement 100. According to some embodiments, portions of the insulation structure 1500 that are removed are based on one or more efficiency requirements of the semiconductor arrangement 100.

Figure 17:
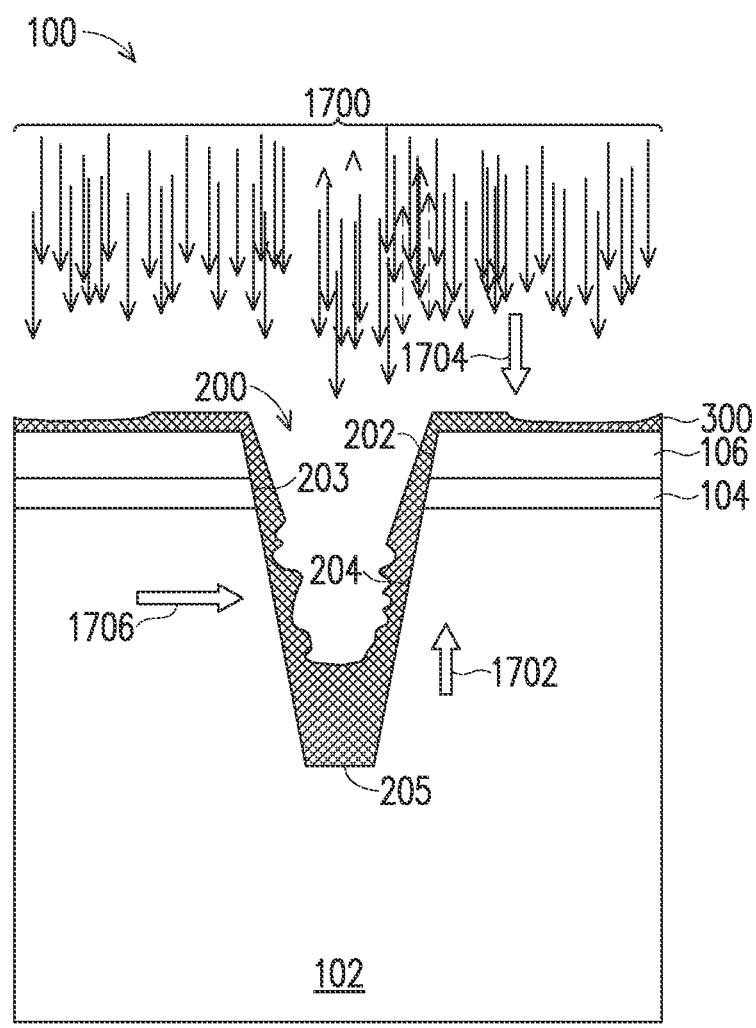
FIGS. 17-19 are cross-sectional views of a semiconductor arrangement at various stages of fabrication, according to some embodiments.
Figure 18:
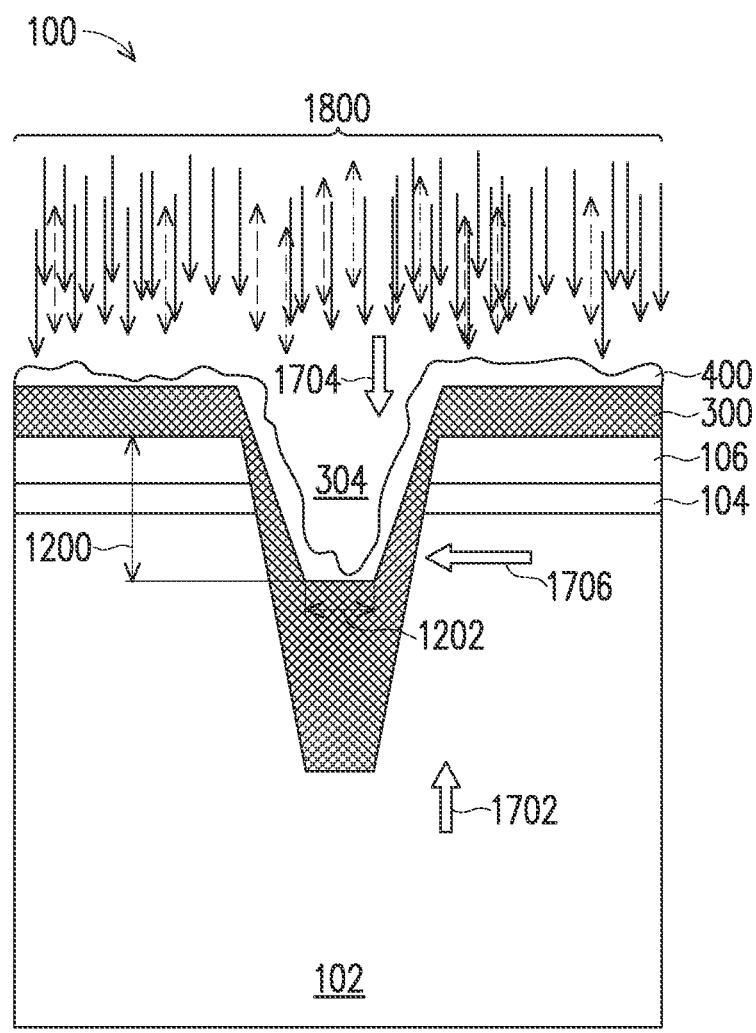
Figure 19:
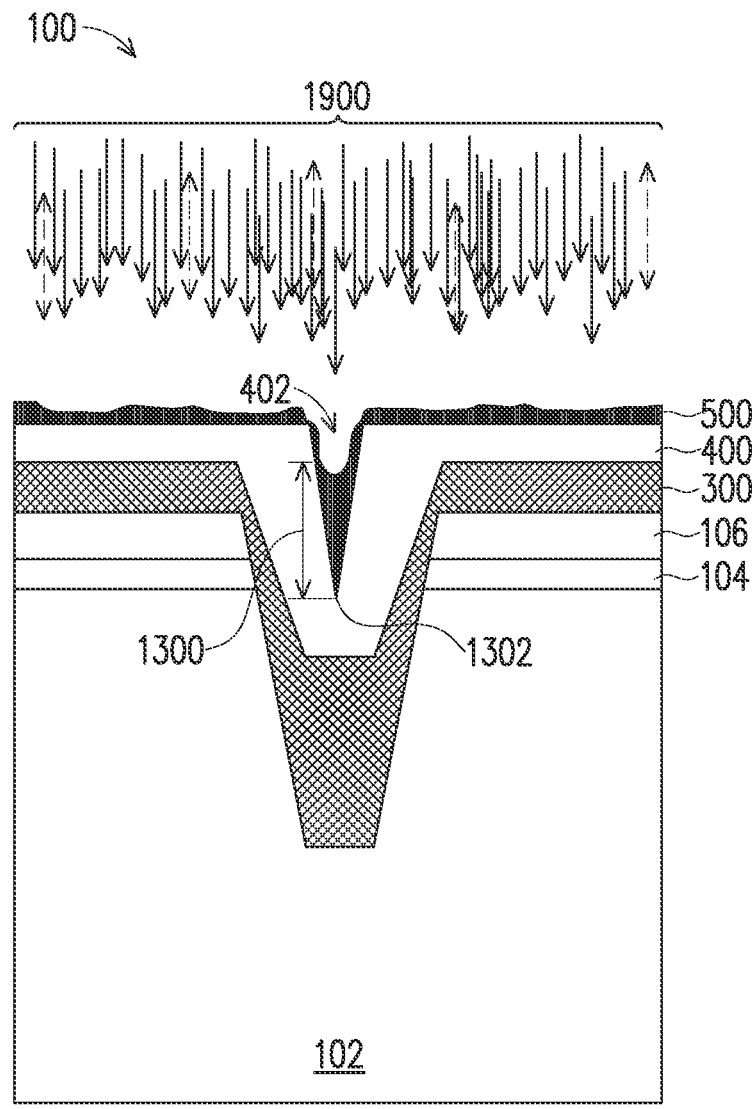

FIGS. 17-19 are cross-sectional views of a semiconductor arrangement 100 at various stages of fabrication, according to some embodiments.

Turning to FIG. 17, according to some embodiments when electrical insulation material is deposited into a trench 200 the electrical insulation material accumulates generally upwardly 1702 from surfaces perpendicular to a direction 1704 of electrical insulation material being deposited, such as the surface 205 of the substrate 102 defining the bottom of the trench 200, and generally inwardly 1706 from surfaces parallel or non-perpendicular to the direction 1704 of electrical insulation material being deposited, such as sidewalls 202, 203, 204 defining sides of the trench 200. When the trench 200 has a relatively high aspect ratio $H_1/W_1$, such as greater than 3, as the electrical insulation material continues to accumulate within the trench 200, it is possible that the electrical insulation material accumulating inwardly from the sidewalls 202, 203, 204 pinches-off, or encloses, an unfilled area in the trench 200. In that event, the point of pinch-off creates a barrier that prevents electrical insulation material from descending further below. When electrical insulation material is prevented from descending below the point of pinch-off and into the unfilled, now enclosed area, a void is fixed in the STI structure. In some embodiments, a void is a physical defect that decreases the effectiveness of the STI structure, such as by altering a dielectric value of at least some of the STI structure.

According to some embodiments, if the aspect ratio $H_1/W_1$ of the trench 200 is relatively high, such as greater than 3, and poses a risk of void formation, an effective deposition rate of electrical insulation material is set relatively high, such as greater than 14. According to some embodiments, the effective deposit or deposition rate corresponds to a rate at which the electrical insulation material is deposited relative to a rate at which deposited electrical insulation material is concurrently or subsequently removed, such as by etching. According to some embodiments, the deposition rate is the rate at which electrical insulation material accumulates on surfaces, such as 202, 203, 204, 205, defining a trench, and the etching rate is the rate at which electrical insulation material is etched or otherwise removed from an electrical insulator layer that is forming in the trench due to the accumulation of electrical insulation material on the surfaces defining the trench. According to some embodiments, Effective Deposit Rate=Deposition Rate−Etching Rate.

According to some embodiments, the effective deposit rate is set high by setting the deposition rate high and setting the etching rate low. According to some embodiments, the effective deposit rate is set high by setting the etching rate to zero. According to some embodiments, the effective deposit rate is set low by setting the etching rate slightly less than the deposition rate. According to some embodiments, the effective deposit rate is set low by setting the deposition rate low and setting the etching rate to zero.

According to some embodiments, etching the first electrical insulator layer 300 comprises sputter-etching the first electrical insulator layer 300. According to some embodiments, the etching rate is the rate at which electrical insulation material is sputter-etched from the first electrical insulator layer 300. According to some embodiments, the effective deposit rate at which the first electrical insulator layer 300 is formed is expressed as a ratio of Deposition Rate/Sputter-Etching Rate ($D_1/S_1$). According to some embodiments, forming the first electrical insulator layer 300 at a relatively high $D_1/S_1$ ratio, such as 15/1, causes the electrical insulation material to accumulate upwardly from the upper surface of the substrate 102 at a rate that at least one of inhibits or substantially inhibits the formation of a void in the first electrical insulator layer 300. According to some embodiments, forming the first electrical insulator layer 300 at a relatively high $D_1/S_1$ ratio causes the first electrical insulation layer 300 to form in a predominantly upwardly 1702 direction.

According to some embodiments, the $D_1/S_1$ ratio is set high for forming the first electrical insulator layer 300 by setting the sputter-etching rate low. According to some embodiments, the $D_1/S_1$ ratio is set high for forming the first electrical insulator layer 300 by setting the deposition rate high. According to some embodiments, the $D_1/S_1$ ratio is set high for forming the first electrical insulator layer 300 by setting the deposition rate high and setting the sputter-etching rate low. According to some embodiments, the $D_1/S_1$ ratio for forming the first electrical insulator layer 300 is greater than 15/1. A relatively high $D_1/S_1$ ratio is illustrated in FIG. 18 by a plurality of arrows 1700. The plurality of arrows includes solid arrows having endpoints in the downward direction, and dashed arrows having endpoints in both the downward and upward directions. The solid arrows represent the electrical insulation material deposition rate. The dashed arrows represent the rate at which the first electrical insulator layer 300 is at least one of sputter-etched or otherwise removed. FIG. 17 illustrates a relatively high $D_1/S_1$ ratio because the ratio of solid arrows to dashed arrows is 60/3=20/1.

Referring to FIGS. 18, according to some embodiments as the first electrical insulator layer 300 forms at a relatively high $D_1/S_1$ ratio, the aspect ratio $H_2/W_2$ of trench 304 progressively decreases because the first electrical insulator layer 300 forms in a predominantly upwardly 1702 direction, thereby at least one of decreasing $H_2$ 1200 or increasing $W_2$ 1202. According to some embodiments, when the aspect ratio $H_2/W_2$ is 2 or approximately 2, the ratio Deposition Rate/Sputter-Etching Rate ($D_2/S_2$) for forming the second electrical insulator layer 400 is modified to be lower than $D_1/S_1$. According to some embodiments, the $D_2/S_2$ ratio is lowered for forming the second electrical insulator layer 400 by decreasing the deposition rate $D_2$. According to some embodiments, the $D_2/S_2$ ratio is lowered for forming the second electrical insulator layer 400 by decreasing the deposition rate and increasing the sputter-etching rate $S_2$. According to some embodiments, the $D_2/S_2$ ratio for forming the second electrical insulator layer 400 is less than 7/1. A relatively low $D_2/S_2$ ratio is illustrated in FIG. 18 by a plurality of arrows 1800. The ratio of solid arrows to dashed arrows is 40/8=5/1, and represents a relatively low $D_2/S_2$ ratio.

Referring to FIG. 19, according to some embodiments due to the relatively low $D_2/S_2$ ratio while forming the second electrical insulator layer 400, $H_3$ 1300 is greater than $W_3$ 1302. According to some embodiments, the aspect ratio $H_3/W_3$ of trench 402 is greater than the aspect ratio $H_2/W_2$ of trench 304. According to some embodiments, when the aspect ratio $H_3/W_3$ of trench 402 is 1 or approximately 1, the ratio Deposition Rate/Sputter-Etching Rate ($D_3/S_3$) for forming the third electrical insulator layer 500 is set higher than $D_2/S_2$. According to some embodiments, the $D_3/S_3$ ratio is set higher for forming the third electrical insulator layer 500 by increasing the deposition rate $D_3$. According to some embodiments, the $D_3/S_3$ ratio is set higher for forming the third electrical insulator layer 500 by increasing the deposition rate $D_3$ and decreasing the sputter-etching rate $S_3$. According to some embodiments, the $D_3/S_3$ ratio for forming the third electrical insulator layer 500 is greater than 7/1 and less than 15/1. A $D_3/S_3$ ratio for forming the third electrical insulator layer 500 is illustrated in FIG. 19 by a plurality of arrows 1900. The ratio of solid arrows to dashed arrows is 50/5=10/1.

Figure 20:
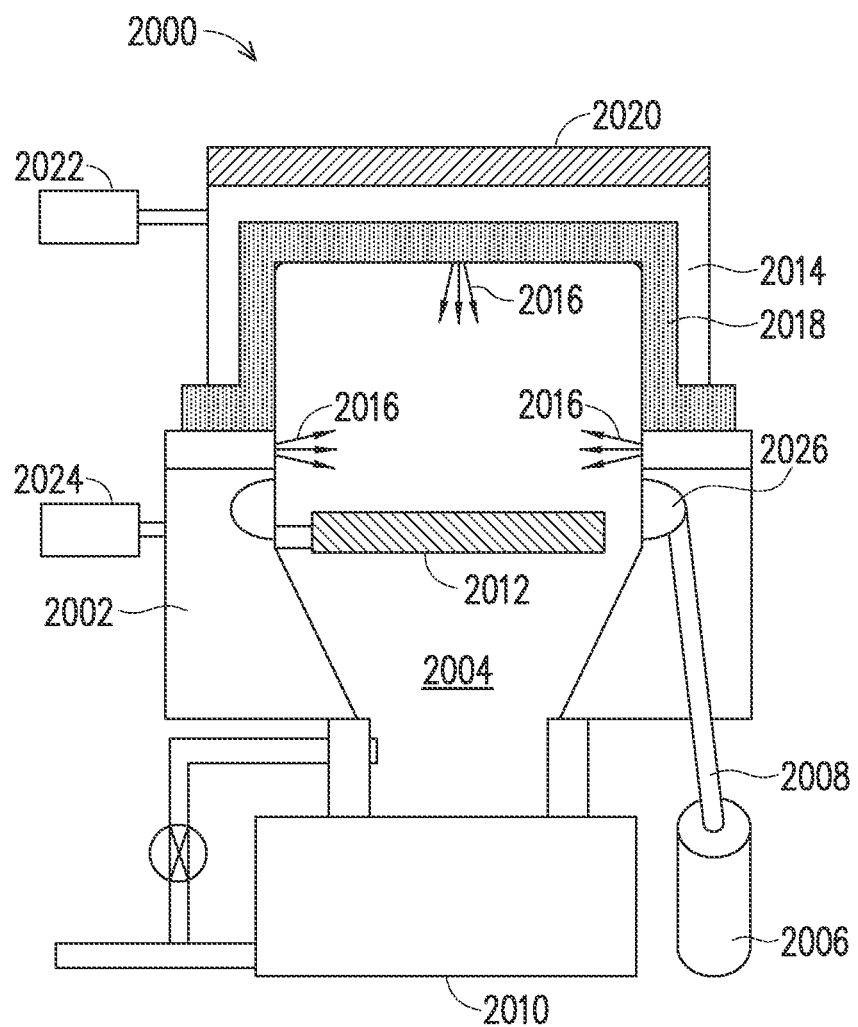
FIG. 20 illustrates at least some of a plasma deposition and sputtering tool, according to some embodiments.

FIG. 20 illustrates at least some of a plasma deposition and sputtering tool 2000, according to some embodiments. The view depicted in FIG. 20 is a cutaway or cross-sectional view to illustrate some internal aspects of the plasma deposition and sputtering tool 2000. However, some input/output components of the plasma deposition and sputtering tool 2000 such as a plasma container 2006, a plasma duct 2008, a turbo pump system 2010, an induction coil RF power controller 2022, and an electrostatic chuck RF power controller 2024 are not depicted as cutaway in FIG. 20 for clarity of illustration. In some embodiments, the plasma deposition and sputtering tool 2000 is a CVD system.

According to some embodiments, the plasma deposition and sputtering tool 2000 includes a chamber body 2002 defining a chamber 2004 within which a tunable electrostatic chuck 2012 or other wafer/substrate support is disposed. In some embodiments, the electrostatic chuck RF power controller 2024 controls at least one of the frequency or the power of the tunable electrostatic chuck 2012. In some embodiments, the electrostatic chuck RF power controller 2024 is at least one of a processor or other suitable controllers.

In some embodiments, the chamber body 2002 comprises at least one of aluminum or other suitable materials. In some embodiments, the tunable electrostatic chuck 2012 comprises at least one of aluminum or other suitable materials. In some embodiments, the plasma deposition and sputtering tool 2000 includes the plasma container 2006 for discharging plasma, such at least one of as $O_2$ or other suitable reactants, via the plasma duct 2008 through a gas port 2026 and into the chamber 2004.

In some embodiments, the plasma deposition and sputtering tool 2000 includes shower heads 2016 defining one or more slits, openings, etc. by or through which a carrier gas is dispersed for even distribution into the chamber 2004. In some embodiments, the induction coil RF power controller 2022 is coupled to a tunable induction coil 2014 and controls the injection of the carrier gas into the chamber 2004 via one or more of the shower heads 2016. In some embodiments, the carrier gas has a molecular mass that is less than 11 atomic mass units (amu). In some embodiments, the carrier gas is Helium.

In some embodiments, the induction coil RF power controller 2022 controls at least one of the frequency or the power of the tunable induction coil 2014. In some embodiments, the induction coil RF power controller 2022 is at least one of a processor or other suitable controllers. According to some embodiments, the induction coil RF power controller 2022 and the electrostatic chuck RF power controller 2024 comprise one processing unit. According to some embodiments, the induction coil RF power controller 2022 comprises a first processing unit, and the electrostatic chuck RF power controller 2024 comprises a second processing unit, different than the first processing unit.

In some embodiments, a precursor gas is introduced into the chamber 2004 via one or more of the shower heads 2016. In some embodiments, the precursor gas is at least one of $SiH_4$ or other suitable gases.

In some embodiments, a ceramic temperature-controlled dome 2018 separates the tunable induction coil 2014 from the chamber body 2002. In some embodiments, a heating/cooling plate 2020 is adjacent the tunable induction coil 2014 for regulating the temperature thereof.

In some embodiments, the turbo pump system 2010 is configured to remove reaction by-products from the chamber 2004. In some embodiments, the turbo pump system 2010 is configured to withstand the high temperature and high reactivity of reaction by-products while removing the reaction by-products.

According to some embodiments, trench-insulation layers are formed in or on a wafer/substrate supported by the tunable electrostatic chuck 2012. The trench-insulation layers are formed from reactants injected into the chamber 2004. In some embodiments, the reactants are $SiH_4$ and $O_2$ and react inside the chamber 2004 to form $SiO_2$. In some embodiments, the chemical formula for forming a trench-insulation layer in or on a wafer/substrate in the chamber 2004 is:

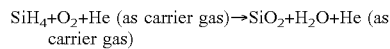

$SiH_4+O_2+He$ (as carrier gas)$\rightarrow SiO_2+H_2O+He$ (as carrier gas)

According to some embodiments, an electrical insulation material deposition rate and an electrical insulator layer sputter-etching rate are influenced by the type of carrier gas that is injected into the chamber 2004. According to some embodiments, the electrical insulation material deposition rate and the electrical insulator layer sputter-etching rate are influenced by the atomic mass of the carrier gas that is injected into the chamber 2004. According to some embodiments, the electrical insulation material deposition rate and the electrical insulator layer sputter-etching rate are inversely proportional to the atomic mass of the carrier gas. According to some embodiments, the lower the atomic mass of the carrier gas, the greater the rate of electrical insulation material deposition and the greater the rate of electrical insulator layer sputter-etching.

According to some embodiments, the electrical insulation material deposition rate and electrical insulator layer sputter-etching rate are based on at least one of the type of carrier gas injected into the chamber 2004, the power sourced by the tunable induction coil 2014, the frequency sourced by the tunable induction coil 2014, the power sourced by the tunable electrostatic chuck 2012, or the frequency sourced by the tunable electrostatic chuck 2012.

According to some embodiments, at least one of the electrical insulation material deposition rate or the electrical insulator layer sputter-etching rate are tuned by adjusting at least one of the type of carrier gas injected into the chamber 2004, the power sourced by the tunable induction coil 2014, the frequency sourced by the tunable induction coil 2014, the power sourced by the tunable electrostatic chuck 2012, or the frequency sourced by the tunable electrostatic chuck 2012. In some embodiments, an electrical field is generated within the chamber 2004 from the power and frequency sourced by the tunable induction coil 2014 and the power and frequency sourced by the tunable electrostatic chuck 2012. In some embodiments, the tunable induction coil 2014 sources a fixed wattage and the tunable electrostatic chuck 2012 sources an adjustable wattage to tune the electrostatic field. In some embodiments, the tunable electrostatic chuck 2012 sources a fixed wattage and the tunable induction coil 2014 sources an adjustable wattage to tune the electrostatic field. In some embodiments, the tunable induction coil 2014 and the tunable electrostatic chuck 2012 each source respective adjustable power frequencies to generate and tune the electrostatic field within the chamber 2004.

In some embodiments, the tunable induction coil 2014 sources a fixed radio frequency power of 5,000 watts or more. In some embodiments, the tunable induction coil 2014 sources a fixed radio frequency power of 7,000 watts.

In some embodiments, the tunable electrostatic chuck 2012 sources a fixed radio frequency power of 2,500 watts or less. In some embodiments, the tunable electrostatic chuck 2012 is adjustable to source one or more predetermined wattages that correspond to a respective insulator deposit rate.

In some embodiments of operation, bombarding ions and electrons are separated from the $O_2$ plasma under the influence of an electrostatic field generated by and between the tunable induction coil 2014 and the tunable electrostatic chuck 2012. In some embodiments the tunable electrostatic chuck 2012 is a wafer-holding electrode. When an RF biasing power source is applied to the tunable electrostatic chuck 2012, a significant ion bombarding (sputter-etching) component is produced during deposition. For substrate trench filling, plasma processing is thus a concurrent deposition/etching process in which loosely deposited oxides are sputtered off by reactive ions during deposition.

In some embodiments, the chamber 2004 is tunable to a D/S ratio greater than 15/1 by at least one of adjusting the tunable induction coil 2014 power to 5,000 watts or more, adjusting the tunable electrostatic chuck 2012 power to 2,500 watts or less, or adjusting the rate of flow of a precursor gas into the chamber 2004 to a relatively high rate.

In some embodiments, the chamber 2004 is tunable to a D/S ratio that is less than 7/1 by at least one of adjusting the tunable induction coil 2014 power to 5,000 watts or more, adjusting the tunable electrostatic chuck 2012 power to greater than 3,000 watts and less than 4,000 watts, or adjusting the rate of flow of a precursor gas into the chamber 2004 to a rate that is lower than the rate of flow of the precursor gas for achieving a D/S ratio greater than 15/1.

In some embodiments, the chamber 2004 is tunable to a D/S ratio that is between 7/1 and 15/1 by at least one of adjusting the tunable induction coil 2014 power to 5,000 watts or more, adjusting the tunable electrostatic chuck 2012 power to greater than 1,000 watts and less than 3,000 watts, adjusting the rate of flow of a precursor gas into the chamber 2004 to a rate that is less than the rate of flow of the precursor gas for achieving a D/S ratio greater than 15/1, or adjusting the rate of flow of a precursor gas into the chamber 2004 to a rate that is greater than the rate of flow of the precursor gas for achieving a D/S ratio less than 7/1.

Fabrication of the semiconductor arrangement 100 as described herein generally includes forming three electrical insulator layers in a trench of a substrate. However, forming other than three electrical insulator layers in a trench of a substrate is contemplated. According to some embodiments, fewer than three electrical insulator layers are formed in a trench of a substrate to form an isolation structure. According to some embodiments, more than three electrical insulator layers are formed in a trench of a substrate to form an isolation structure. According to some embodiments, at least due to the different electrical insulator layers being formed separately, at different times, under different conditions, etc., a value of a measurable physical property, such as density, of one of the electrical insulator layers is different than a value of the measurable physical property of one of the other electrical insulator layers.

According to some embodiments, a method of forming a semiconductor arrangement includes forming a first electrical insulator layer in a trench in a semiconductor substrate at a first rate and forming a second electrical insulator layer over the first electrical insulator layer at a second rate, wherein the second rate is less than the first rate.

According to some embodiments, forming the first electrical insulator layer includes forming an oxide layer.

According to some embodiments, the method includes forming a dielectric layer on the semiconductor substrate and forming the trench by etching the dielectric layer and the semiconductor substrate.

According to some embodiments, forming the first electrical insulator layer includes depositing electrical insulation material over the semiconductor substrate at a third rate and sputter-etching the first electrical insulator layer at a fourth rate, wherein a ratio of the third rate to the fourth rate is greater than 15/1.

According to some embodiments, forming the second electrical insulator layer includes depositing electrical insulation material over the first electrical insulator layer at a third rate and sputter-etching the second electrical insulator layer at a fourth rate, wherein a ratio of the third rate to the fourth rate is less than 7/1.

According to some embodiments, the method includes forming a third electrical insulator layer over the second electrical insulator layer at a third rate, wherein the third rate is greater than the second rate.

According to some embodiments, forming the third electrical insulator layer includes depositing electrical insulation material over the second electrical insulator layer at a fourth rate and sputter-etching the third electrical insulator layer at a fifth rate, wherein a ratio of the fourth rate to the fifth rate is within a range of 7/1 to 15/1.

According to some embodiments, the trench has a first aspect ratio of height-to-width ($H_1/W_1$), forming the first electrical insulator layer includes forming the first electrical insulator layer to have a first electrical insulator layer trench having a second aspect ratio of height-to-width ($H_2/W_2$), and $H_2/W_2$ is less than $H_1/W_1$.

According to some embodiments, the method includes forming a first conductive region in the semiconductor substrate adjacent the first electrical insulator layer and forming a second conductive region in the semiconductor substrate adjacent the first electrical insulator layer, wherein the first conductive region is different than the second conductive region.

According to some embodiments, a semiconductor arrangement includes an isolation structure having a first electrical insulator layer in a trench in a semiconductor substrate and a second electrical insulator layer in the trench and over the first electrical insulator layer.

According to some embodiments, the first electrical insulator layer has a measurable physical property, the second electrical insulator layer has the measurable physical property, and a value of the measurable physical property of the first electrical insulator layer is different than a value of the measurable physical property of the second electrical insulator layer.

According to some embodiments, the measurable physical property is density.

According to some embodiments, an aspect ratio of the trench is heights/widths ($H_1/W_1$), an aspect ratio of a first electrical insulator layer trench in the first electrical insulator layer is height$_2$/width$_2$ ($H_2/W_2$), and $H_2/W_2$ is different than $H_1/W_1$.

According to some embodiments, the isolation structure includes a third electrical insulator layer in the trench and over the second electrical insulator layer.

According to some embodiments, $H_2/W_2$ is less than $H_1/W_1$.

According to some embodiments, the semiconductor arrangement includes a first conductive region in the semiconductor substrate adjacent a first sidewall of the isolation structure and a second conductive region in the semiconductor substrate adjacent a second sidewall of the isolation structure.

According to some embodiments, the first conductive region is at least one of a drain region or a source region.

According to some embodiments, the first electrical insulator layer is a first oxide layer, and the second electrical insulator layer is a second oxide layer.

According to some embodiments, a method of forming a semiconductor arrangement includes forming a trench in a semiconductor substrate, forming a first oxide layer in the trench, wherein the first oxide layer has a first density, and forming a second oxide layer in the trench over the first oxide layer, wherein the second oxide layer has a second density, and the second density is different than the first density.

According to some embodiments, the method includes forming a third oxide layer in the trench over the second oxide layer, wherein the third oxide layer has a third density, different than the second density.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally to be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
an isolation structure comprising:
a first electrical insulator layer in a trench in a semiconductor substrate;
a second electrical insulator layer in the trench and over the first electrical insulator layer, wherein:
a first sidewall of the first electrical insulator layer faces the second electrical insulator layer and a second sidewall of the first electrical insulator layer faces away from the second electrical insulator layer,
in a first plane extending substantially parallel to a top surface of the semiconductor substrate, the first electrical insulator layer has a first width measured from the first sidewall to the second sidewall,
in a second plane extending substantially parallel to the top surface of the semiconductor substrate, the first electrical insulator layer has a second width measured from the first sidewall to the second sidewall,
the second plane is closer to the top surface of the semiconductor substrate than the first plane, and
the second width is less than the first width; and
a third electrical insulator layer in the trench and over the second electrical insulator layer, wherein the third electrical insulator layer fills a remainder of the trench not occupied by the first electrical insulator layer and the second electrical insulator layer.

2. The semiconductor arrangement of claim 1, wherein:
the first electrical insulator layer has a measurable physical property,
the second electrical insulator layer has the measurable physical property, and
a value of the measurable physical property of the first electrical insulator layer is different than a value of the measurable physical property of the second electrical insulator layer.

3. The semiconductor arrangement of claim 2, wherein the measurable physical property is density.

4. The semiconductor arrangement of claim 1, wherein:
an aspect ratio of the trench is $height_1/width_1$ ($H_1/W_1$),
an aspect ratio of a first electrical insulator layer trench in the first electrical insulator layer is $height_2/width_2$ ($H_2/W_2$), and
$H_2/W_2$ is different than $H_1/W_1$.

5. The semiconductor arrangement of claim 4, wherein $H_2/W_2$ is less than $H_1/W_1$.

6. The semiconductor arrangement of claim 1, comprising:
a first conductive region in the semiconductor substrate adjacent a first sidewall of the isolation structure; and
a second conductive region in the semiconductor substrate adjacent a second sidewall of the isolation structure.

7. The semiconductor arrangement of claim 6, wherein the first conductive region is at least one of a drain region or a source region.

8. The semiconductor arrangement of claim 1, wherein:
the first electrical insulator layer is a first oxide layer, and
the second electrical insulator layer is a second oxide layer.

9. The semiconductor arrangement of claim 1, comprising:
a doped region laterally adjacent and underlying the isolation structure, wherein a first portion of the doped region has a first concentration of dopants and a second portion of the doped region has a second concentration of dopants different than the first concentration of dopants.

10. The semiconductor arrangement of claim 9, wherein a third portion of the doped region has a third concentration of dopants different than the second concentration of dopants and different than the first concentration of dopants.

11. The semiconductor arrangement of claim 9, wherein a sidewall of the isolation structure is in contact with the first portion of the doped region and the second portion of the doped region.

12. The semiconductor arrangement of claim 11, wherein a bottom surface of the isolation structure is in contact with the second portion of the doped region.

13. A semiconductor arrangement, comprising:
an isolation structure comprising:
a first electrical insulator layer;
a second electrical insulator layer in contact with sidewalls of the first electrical insulator layer, wherein the second electrical insulator layer has a first depth measured from a top surface of a semiconductor substrate in which the isolation structure is disposed to a bottommost surface of the second electrical insulator layer below the top surface of the semiconductor substrate; and
a third electrical insulator layer in contact with sidewalls of the second electrical insulator layer,
wherein:
the third electrical insulator layer has a second depth measured from the top surface of the semiconductor substrate to a bottommost surface of the third electrical insulator layer below the top surface of the semiconductor substrate, and
the first depth is at least two times the second depth;
a source/drain region; and
a gate stack, wherein the source/drain region is between the isolation structure and the gate stack.

14. The semiconductor arrangement of claim 13, wherein an interface is defined where the second electrical insulator layer contacts the sidewalls of the first electrical insulator layer.

15. The semiconductor arrangement of claim 13, wherein an interface is defined where the third electrical insulator layer contacts the sidewalls of the second electrical insulator layer.

16. The semiconductor arrangement of claim 13, wherein the first electrical insulator layer has a first density and the second electrical insulator layer has a second density different than the first density.

17. A semiconductor arrangement, comprising:
an isolation structure disposed within a semiconductor substrate, the isolation structure comprising:
a first electrical insulator layer having a first density, wherein the first electrical insulator layer has a first depth measured from a top surface of the semiconductor substrate to a bottommost surface of the first electrical insulator layer; and
a second electrical insulator layer having a second density different than the first density, wherein:
the second electrical insulator layer is laterally separated from the semiconductor substrate by the first electrical insulator layer,
the second electrical insulator layer has a second depth measured from the top surface of the semiconductor substrate to a bottommost surface of the second electrical insulator layer, and
the first depth is at least two times the second depth; and
a doped region laterally adjacent and underlying the isolation structure, wherein:
a first portion of the doped region has a first concentration of dopants,
a second portion of the doped region has a second concentration of dopants different than the first concentration of dopants, and
a first portion of a sidewall of the isolation structure is in contact with the first portion of the doped region and a second portion of the sidewall of the isolation structure below the first portion is in contact with the second portion of the doped region.

18. The semiconductor arrangement of claim 17, comprising a third electrical insulator layer, wherein the third electrical insulator layer is laterally separated from the semiconductor substrate by the second electrical insulator layer.

19. The semiconductor arrangement of claim 17, comprising a source/drain region, wherein the first electrically insulator layer is between the source/drain region and the second electrical insulator layer.

20. The semiconductor arrangement of claim 1, comprising:
a source/drain region; and
a gate stack, wherein the source/drain region is between the isolation structure and the gate stack.

\* \* \* \* \*